(12) United States Patent
Kahn et al.

(10) Patent No.: US 10,777,697 B1
(45) Date of Patent: Sep. 15, 2020

(54) PHOTOVOLTAIC ASSEMBLIES CAPABLE OF COMMUNICATING AN EVENT OCCURRENCE, AND ASSOCIATED SYSTEMS AND METHODS

(71) Applicant: Maxim Integrated Products, Inc., San Jose, CA (US)

(72) Inventors: Seth M. Kahn, San Francisco, CA (US); Charles J. Razzell, Pleasanton, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 25 days.

(21) Appl. No.: 16/011,877

(22) Filed: Jun. 19, 2018

Related U.S. Application Data

(60) Provisional application No. 62/521,780, filed on Jun. 19, 2017.

(51) Int. Cl.
| | |
|---|---|
| *H01L 31/0465* | (2014.01) |
| *H04B 3/54* | (2006.01) |
| *H02M 3/156* | (2006.01) |
| *H02J 3/38* | (2006.01) |

(52) U.S. Cl.
CPC .......... *H01L 31/0465* (2014.12); *H02J 3/383* (2013.01); *H02M 3/156* (2013.01); *H04B 3/54* (2013.01)

(58) Field of Classification Search
CPC ........ H01L 31/0465; H02J 3/383; H04B 3/54; H02M 3/156
See application file for complete search history.

(56) References Cited

U.S. PATENT DOCUMENTS

| | | | |
|---|---|---|---|
| 2013/0051092 A1* | 2/2013 | Cooper ................... | H02J 3/383 363/37 |
| 2013/0092208 A1* | 4/2013 | Robbins ............ | H01L 31/02021 136/244 |
| 2014/0373894 A1* | 12/2014 | Stratakos ................ | H02S 50/00 136/244 |

\* cited by examiner

*Primary Examiner* — Akm Zakaria
(74) *Attorney, Agent, or Firm* — Lathrop GPM LLP

(57) ABSTRACT

A method for communicating an event occurrence among a plurality of photovoltaic assemblies of a photovoltaic system includes the following steps: (1) in response to the event occurrence, injecting a first signal onto a power line at a first photovoltaic assembly of the plurality of photovoltaic assemblies, (2) detecting the first signal on the power line at a second photovoltaic assembly of the plurality of photovoltaic assemblies, and (3) in response to detecting the first signal on the power line at the second photovoltaic assembly, injecting a second signal onto the power line at the second photovoltaic assembly.

19 Claims, 20 Drawing Sheets

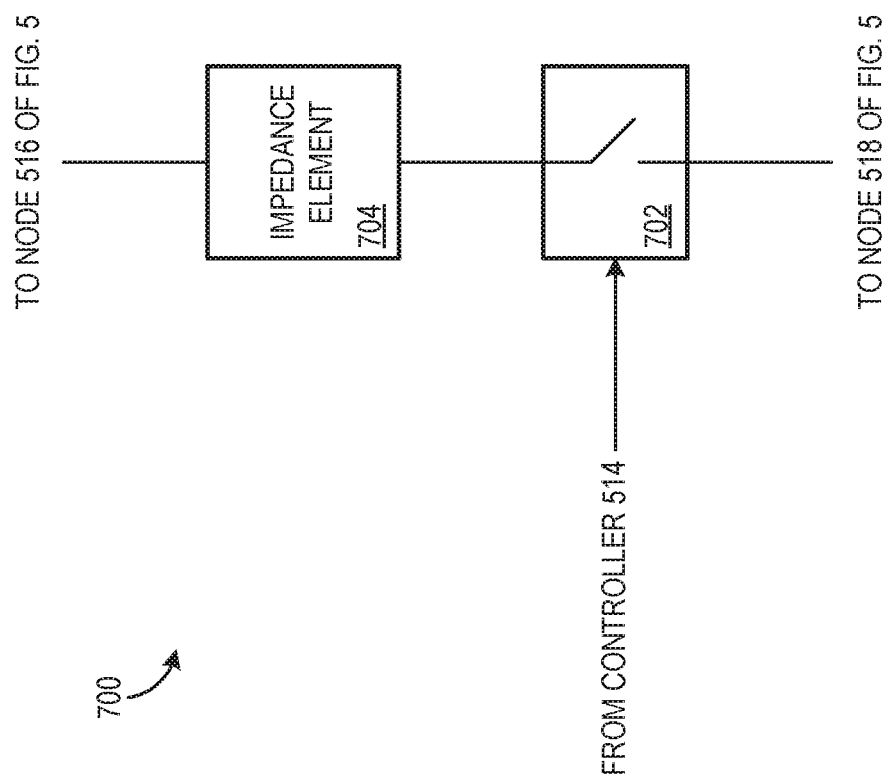

PHOTOVOLTAIC ASSEMBLIES CAPABLE OF COMMUNICATING AN EVENT OCCURRENCE, AND ASSOCIATED SYSTEMS AND METHODS

RELATED APPLICATIONS

This application claims benefit of priority to U.S. Provisional Patent Application Ser. No. 62/521,780, filed Jun. 19, 2017, which is incorporated herein by reference.

BACKGROUND

Photovoltaic systems are increasingly used to supply electric power. For example, many buildings include rooftop photovoltaic systems for supplying some or all of the building's electric power. As another example, electric utilities have built large photovoltaic systems, sometimes referred to as solar "farms," for supplying electric power to large numbers of customers.

A single photovoltaic cell typically generates electric power at less than one volt. Many electric power applications, however, require voltages that are much higher than one volt. For example, inverters powered by photovoltaic systems often require input voltages of several hundred volts. Therefore, many photovoltaic systems include a large number photovoltaic cells electrically coupled in series to obtain a sufficiently high voltage for their application. Additionally, many photovoltaic systems include two or more strings of photovoltaic devices electrically coupled in parallel to achieve a desired system power generation capacity.

FIG. 1 illustrates a prior art photovoltaic system 100 including a first string 102 electrically coupled in parallel with a second string 104. String 102 includes M photovoltaic devices 106 electrically coupled in series, and string 104 includes N photovoltaic devices 108 electrically coupled in series, where M and N are each positive integers greater than one. In this document, specific instances of an item may be referred to by use of a numeral in parentheses (e.g., photovoltaic device 106(1)) while numerals without parentheses refer to any such item (e.g., photovoltaic devices 106). Photovoltaic devices 106, 108 are either individual photovoltaic cells or groups of electrically coupled photovoltaic cells. First and second strings 102, 104 are electrically coupled in parallel with a load 110.

High voltages may exist in many photovoltaic systems. For example, each string 102, 104 of photovoltaic system 100 will often include many series-coupled photovoltaic cells, such that voltage across power rails 112, 114 will often exceed one hundred volts, especially in systems coupled through inverters to alternating current (AC) power grids. Indeed, photovoltaic systems are often rated at 600 volts or 1,000 volts. Additionally, many photovoltaic systems are capable of supplying significant current. Accordingly, photovoltaic systems may experience an electrical arc, where gas (typically air) between two nearby nodes ionizes due to a large voltage between the nodes, resulting in current flow between the nodes. Such potential for an electrical arc is compounded by the fact that typical photovoltaic systems include many electrical connectors and long electrical cables, thereby presenting many possible points of failure. Additionally, photovoltaic systems are often subjected to hostile environmental conditions, such as extreme temperatures and intense ultraviolet radiation, which may cause connector or insulation failure, particularly over the long lifetimes expected of typical photovoltaic systems. Furthermore, some photovoltaic systems are vulnerable to physical damage, such as from maintenance personnel working in the system's vicinity, or from an animal chewing on the system's components.

A photovoltaic system electrical arc can be classified as either a series electrical arc or a parallel electrical arc. A series electrical arc occurs across an opening in a series electrical circuit, such as across an opening caused by a connector failure. For example, FIG. 2 illustrates a series electrical arc 202 across an opening 204 in first string 102 of photovoltaic system 100. A parallel electrical arc occurs between two nodes of a photovoltaic system, or between a node and ground, such as due to an insulation failure. FIG. 3 illustrates a parallel electrical arc 302 between a node 116 of second string 104 and negative power rail 114 of photovoltaic system 100.

Photovoltaic system electrical arcs are usually highly undesirable because their heat can injure a person or animal in the system's vicinity, start a fire, damage the photovoltaic system, and/or generate electrical noise which can disrupt proper operation of nearby electrical circuitry. Additionally, an energized photovoltaic system may present an electrical shock hazard to firefighters attending to an arc-induced fire. Consequently, arc fault detectors and arc fault circuit interrupters have been developed for photovoltaic systems. An arc fault detector (AFD) detects occurrence of an electrical arc in a photovoltaic system, and an arc fault circuit interrupter (AFCI) opens an electrical circuit of the photovoltaic system in response to the detected electrical arc, to help de-energize the photovoltaic system. In some cases, an AFD and an AFCI are combined into a single device which is capable of detecting occurrence of an electrical arc and opening an electrical circuit in response thereto.

AFDs typically detect occurrence of an electrical arc by identifying high frequency components, or "noise," of photovoltaic system current that is generated by the electrical arc. The noise's amplitude is very small and must be increased by amplification, or by use of a current transformer, for detection. Additionally, the noise must be distinguished from other high frequency components commonly present in photovoltaic system current, such as switching power converter ripple current and harmonics thereof. Thus, AFDs typically decompose photovoltaic system current into its constituent AC components using Fast Fourier Transform (FFT) techniques, or similar frequency detection techniques, to distinguish electrical arc noise from other system noise.

It is sometimes necessary to completely de-energize a photovoltaic system to extinguish an electrical arc. Additionally, it is generally desirable to completely shut down a photovoltaic system upon an occurrence of an electrical arc to promote safety and to minimize equipment damage risk. Furthermore, a given AFD is often only able to detect electrical arcs occurring near the AFD, because electrical arc noise is significantly attenuated as it travels through the photovoltaic system. Accordingly, some photovoltaic systems include distributed AFDs and AFCIs, such as within each photovoltaic module, to maximize likelihood that an electrical arc occurrence will be detected, and to enable the photovoltaic system to be completely shut down upon detection of the electrical arc occurrence.

Conventional photovoltaic systems including an AFD and AFCI with each photovoltaic assembly require communication among photovoltaic assemblies and/or communication with a central management device to ensure complete photovoltaic system shutdown in response to detection of an electrical arc occurrence, and/or to ensure complete photovoltaic system shutdown for maintenance or other periods of non-use. For example, consider a scenario where an electrical arc occurs near an edge of a photovoltaic system. An AFD of a photovoltaic assembly distant from the system edge may not detect the electrical arc due to attenuation of its associated electrical noise. Consequentially, an AFD near the system edge must communicate detection of the electrical arc occurrence to the distant photovoltaic assembly, or to a central management device capable of shutting down the entire photovoltaic system, to ensure that the distant photovoltaic assembly shuts down in response to detection of the electrical arc occurrence. Such communication among photovoltaic assemblies is conventionally achieved, for example, by a wired communication network, a wireless communication network, an optical communication network, or a power line communication network.

BRIEF DESCRIPTION OF THE DRAWINGS

FIG. 7 illustrates one possible embodiment of an injection subsystem of the FIG. 5 photovoltaic assembly.

DETAILED DESCRIPTION OF THE EMBODIMENTS

Applicant has developed photovoltaic assemblies, and associated systems and methods, capable of communicating an event occurrence, such as an electrical arc occurrence. For example, in certain embodiments, a photovoltaic system includes a plurality of photovoltaic assemblies having respective output ports, and each output port is electrically coupled to a common power line for delivering power to a load. Each photovoltaic assembly is configured to detect an electrical arc occurrence in the photovoltaic system, from an electrical signal at its respective output port, and in response, the photovoltaic assembly injects a signal onto its output port for detection by another photovoltaic assembly. The injected signal has characteristics similar to an electrical arc, so that photovoltaic assemblies receiving the injected signal detect occurrence of the electrical arc in response to the signal. Accordingly, the photovoltaic assemblies are capable of relaying the electrical arc occurrence throughout the photovoltaic system to ensure, or to at least increase the likelihood of, each photovoltaic assembly detecting the electrical arc occurrence.

Figure 1:
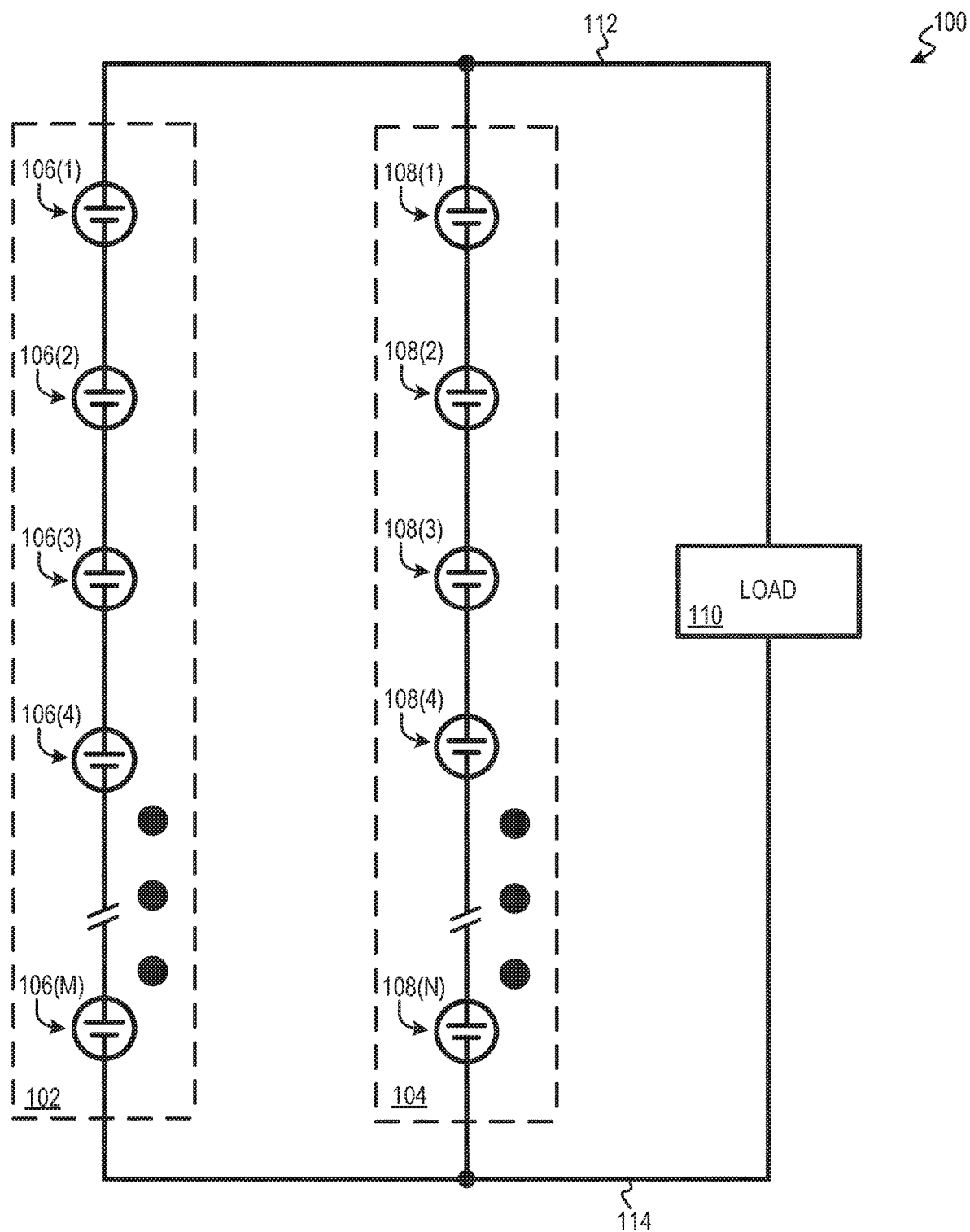
FIG. 1 illustrates a prior art photovoltaic system.
Figure 2:
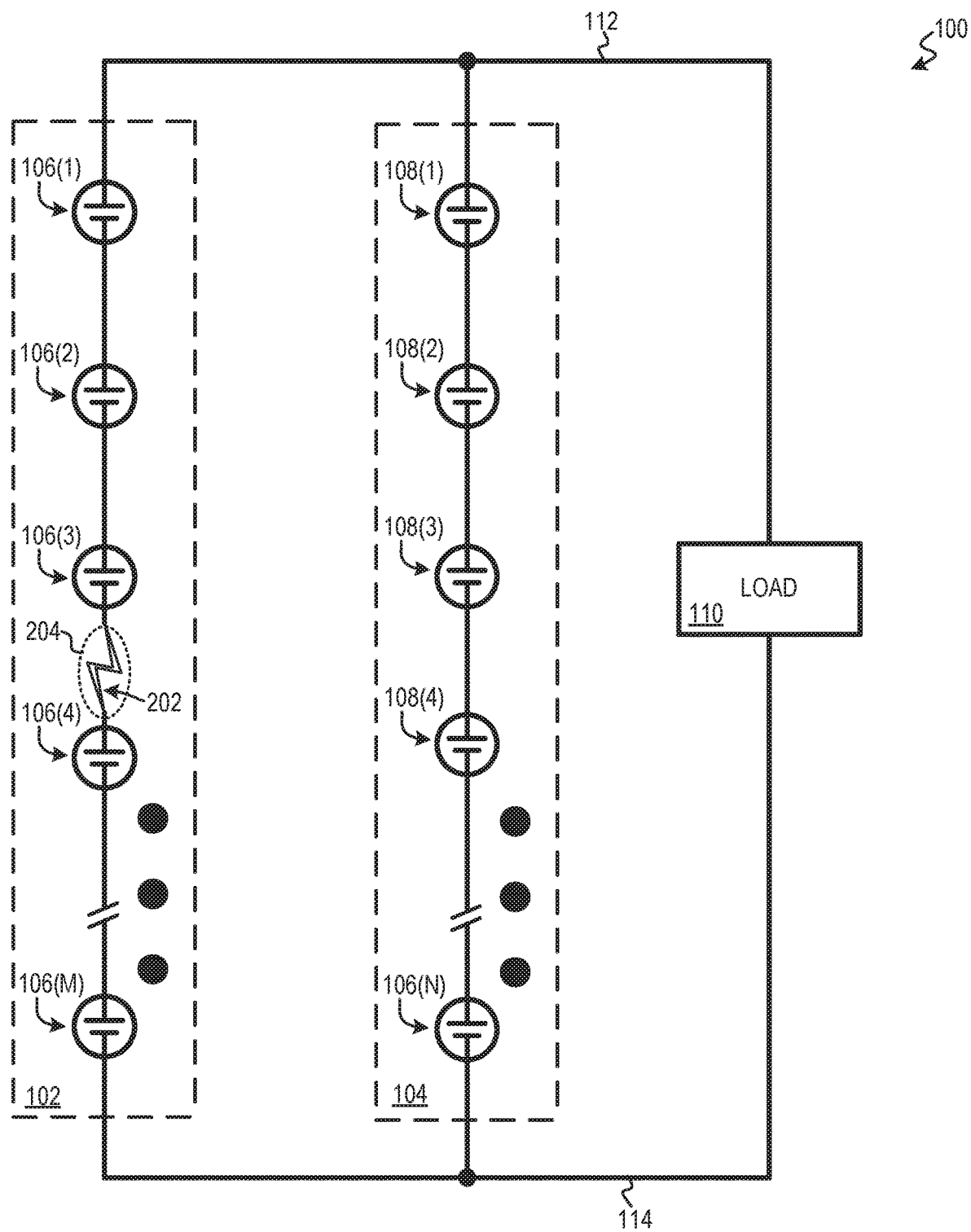
FIG. 2 illustrates an example of a series electrical arc in the FIG. 1 photovoltaic system.
Figure 3:
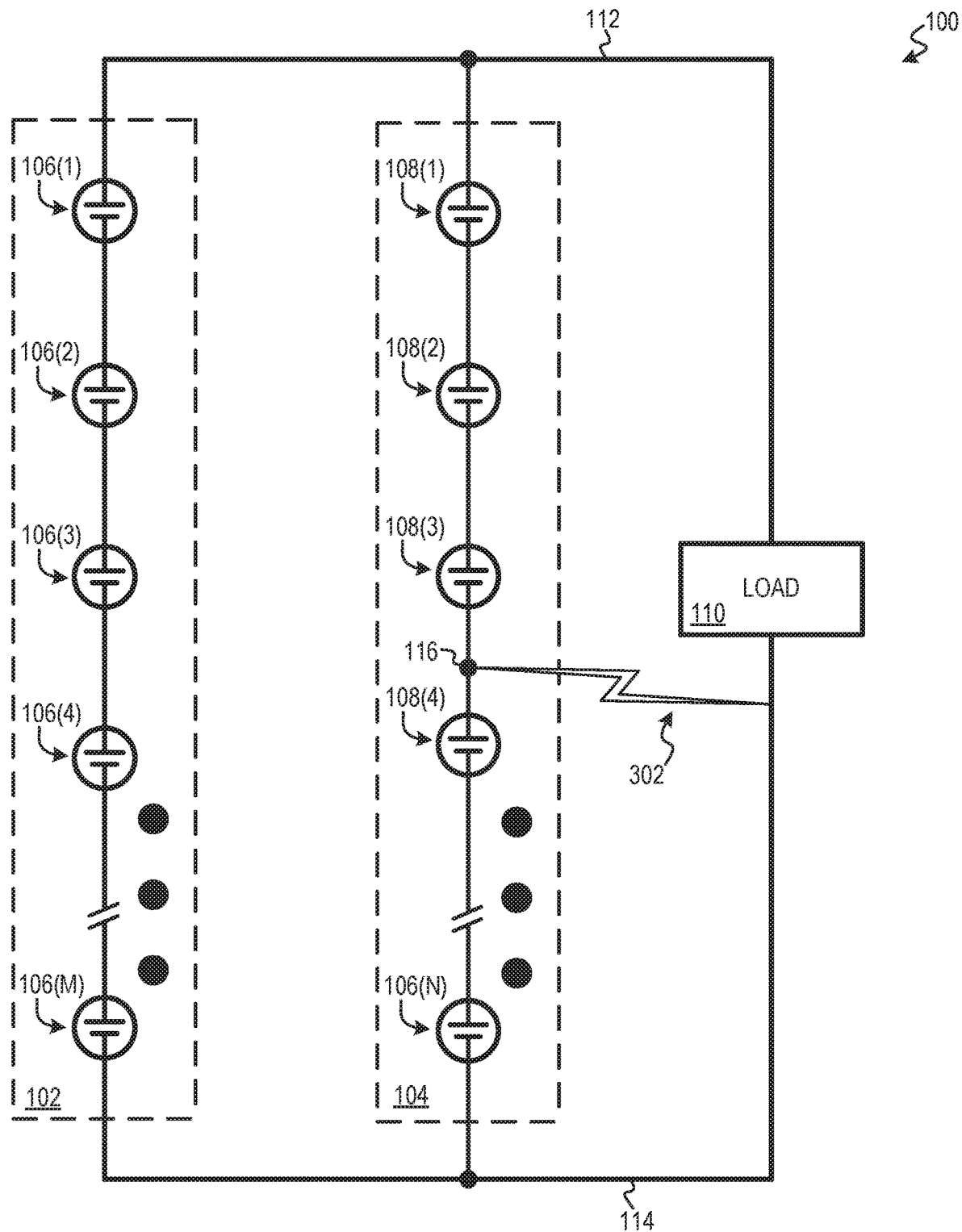
FIG. 3 illustrates an example of a parallel electrical arc in the FIG. 1 photovoltaic system.
Figure 4:
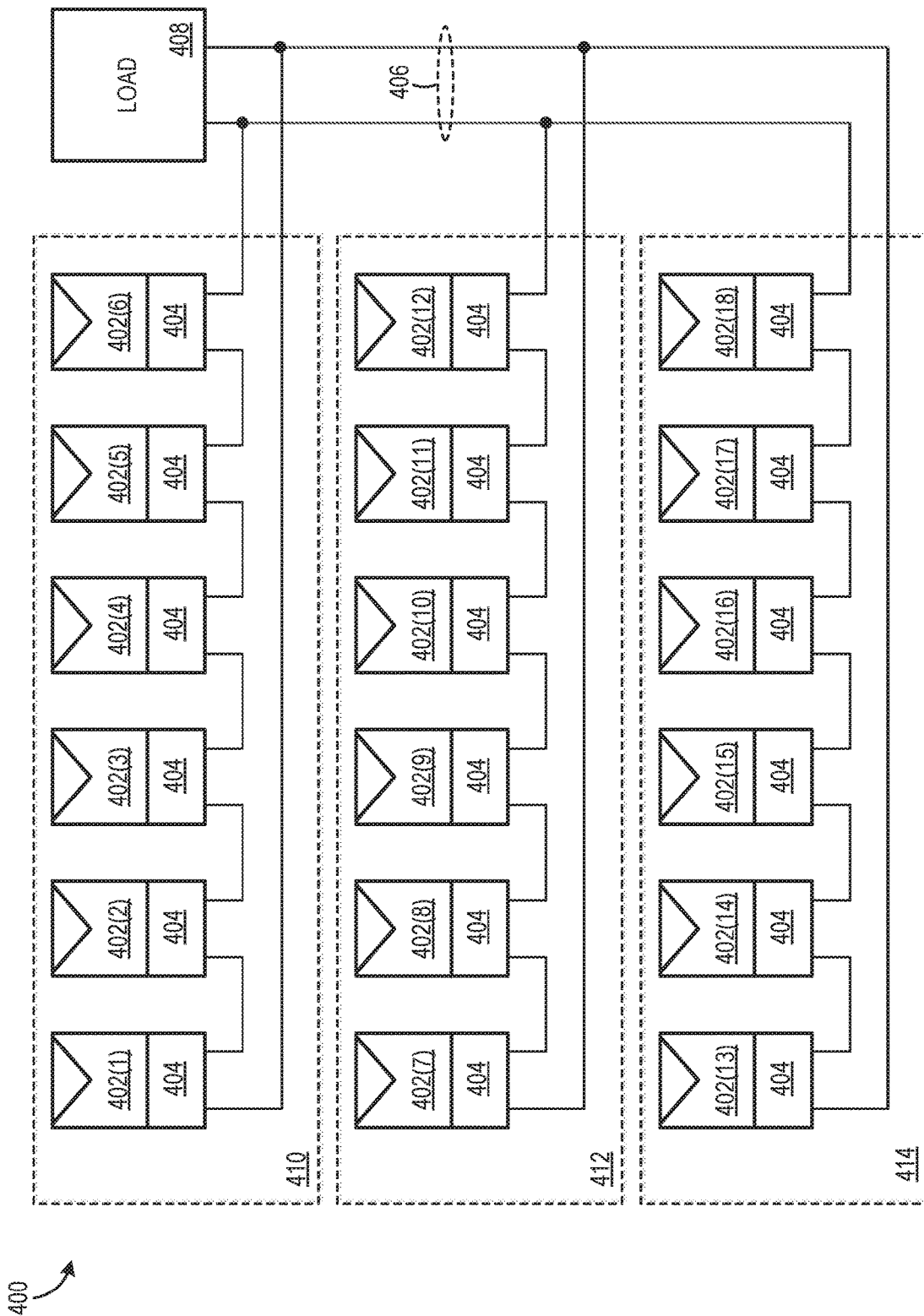
FIG. 4 illustrates a photovoltaic system including a plurality of photovoltaic assemblies, where each photovoltaic assembly is capable of communicating an electrical arc occurrence, according to an embodiment.

FIG. 4 illustrates a photovoltaic system 400 including a plurality of photovoltaic assemblies 402, where each photovoltaic assembly 402 is capable of communicating an electrical arc occurrence within photovoltaic system 400. Each photovoltaic assembly 402 has a respective output port 404, and each output port 404 is electrically coupled to a common power line 406. A load 408, such as an inverter or a battery charger, is optionally electrically coupled to power line 406. Photovoltaic assemblies 402 are capable of generating electrical power in response to incident light, and power line 406 transmits the generated electrical power to load 408 or other circuitry (not shown) electrically coupled to power line 406. Photovoltaic assemblies 402 are electrically connected into three strings 410, 412, and 414 by power line 406. Output ports 404 of photovoltaic assemblies 402 are electrically coupled in series within each string 410, 412, and 414, and each string 410, 412, and 414 is electrically coupled in parallel with load 408, by power line 406. The number of photovoltaic assemblies 402, and the electrical topology of their interconnection, may be varied without departing from the scope hereof. For example, photovoltaic system 400 could be varied to include additional or fewer strings 410, 412, and 414, and the number of photovoltaic assemblies 402 in each string could vary. In one particular alternate embodiment, photovoltaic system 400 includes only a single string.

Figure 5:
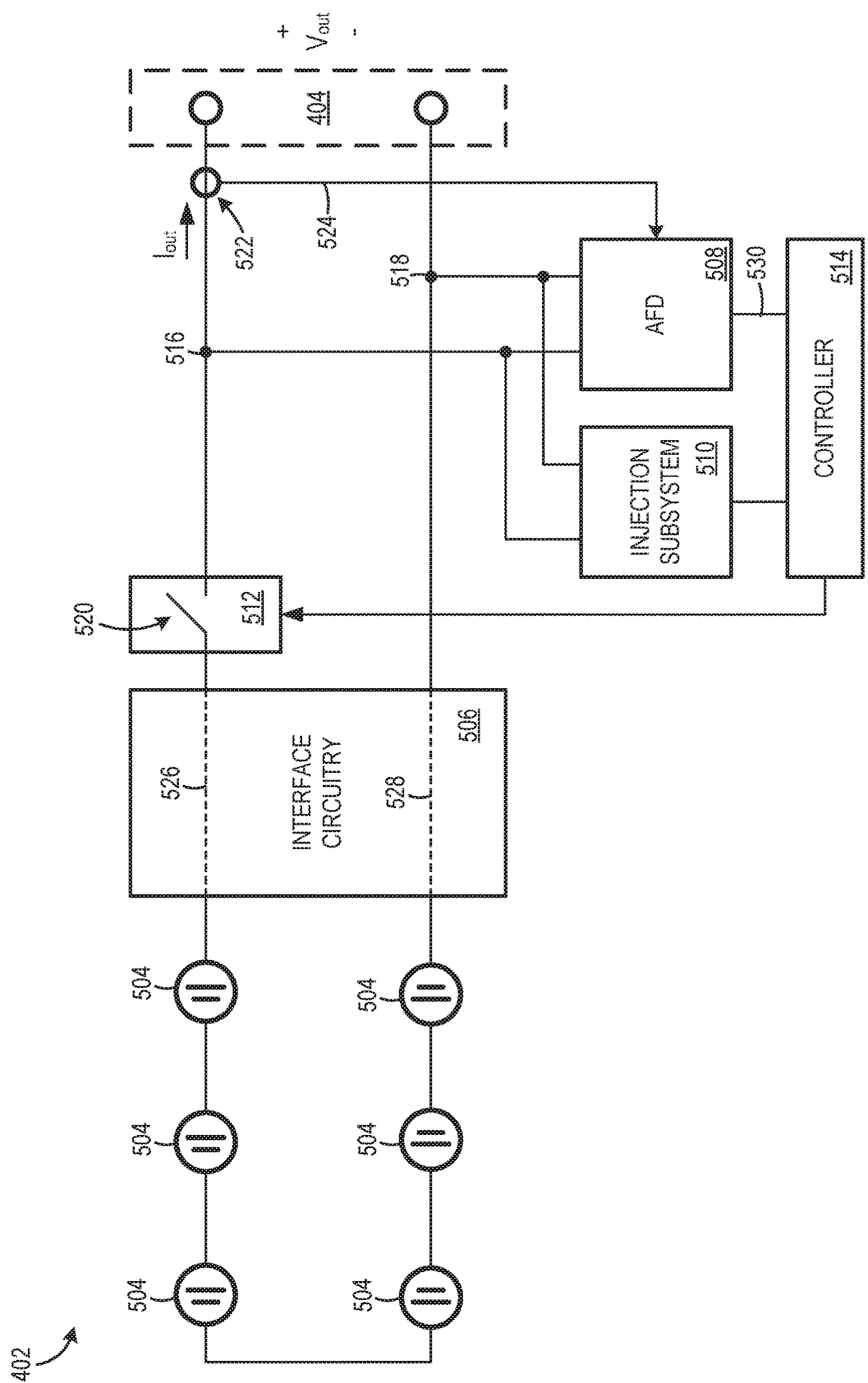
FIG. 5 illustrates one instance of the FIG. 4 photovoltaic assemblies in greater detail.

FIG. 5 illustrates one instance of photovoltaic assembly 402 in greater detail. Each photovoltaic assembly 402 includes one output port 404, one or more photovoltaic cells 504, interface circuitry 506, an electrical arc fault detector 508, an injection subsystem 510, an optional shutdown subsystem 512, and a controller 514. Interface circuitry 506 electrically interfaces photovoltaic cells 504 with output port 404, and output port 404 is electrically coupled between a positive output power node 516 and a reference power node 518. In some embodiments, interface circuitry 506 is embodied by electrical conductors, such as bus bars or wires, as illustrated by dashed lines 526 and 528 in FIG. 5, which simply electrically connect photovoltaic cells 504 to output port 404. In some other embodiments, interface circuitry 506 includes more complex circuitry, such as a DC-to-DC converter with maximum power point tracking (MPPT) capability, electrically interfacing photovoltaic cells 504 with output port 404.

Photovoltaic cells 504 are, for example, crystalline silicon photovoltaic cells or thin-film photovoltaic cells, and photovoltaic cells 504 may be single-junction or multi-junction photovoltaic cells. Each photovoltaic cell 504 need not necessarily have the same configuration. Although FIG. 5 illustrates photovoltaic assembly 402 as including six photovoltaic cells 504 electrically coupled in series, the number of photovoltaic cells 504 and their electrical connection topology may be varied without departing from the scope hereof. For example, photovoltaic assembly 402 could be modified to include only a single photovoltaic cell 504 electrically interfaced to output port 404 by interface circuitry 506. As another example, photovoltaic assembly 402 could be modified to include an array of photovoltaic cells 504 electrically coupled in series and/or parallel, where the array is electrically interfaced to output port 404 by interface circuitry 506. Accordingly, each photovoltaic assembly 402 is, for example, a photovoltaic panel, a photovoltaic module of a photovoltaic panel, or a submodule of a photovoltaic module.

Electrical arc fault detector 508 detects an electrical arc occurrence within photovoltaic system 400, such as an electrical arc within a photovoltaic assembly 402, an electrical arc along power line 406, or an electrical arc within load 408, from an electrical signal at output port 404. For example, in some embodiments, electrical arc fault detector 508 monitors voltage $V_{out}$ across output port 404 to identify one or more AC components indicating an electrical arc occurrence. In some other embodiments, electrical arc fault detector 508 monitors current $I_{out}$ flowing through output port 404 to identify one or more AC components of current $I_{out}$ indicating an electrical arc occurrence. In yet other embodiments, electrical arc fault detector 508 monitor both voltage $V_{out}$ and current $I_{out}$ to detect the electrical arc occurrence. Accordingly, electrical arc fault detector 508 detects an electrical arc from presence of frequencies at output port 404 that are not present during normal operation of photovoltaic system 400, and electrical arc fault detector 508 can therefore be considered an abnormal frequency detector.

In embodiments where electrical arc fault detector 508 monitors current $I_{out}$, photovoltaic assembly 402 optionally additionally includes a current sensing subsystem 522 which generates a signal 524 representing current $I_{out}$, and signal 524 is communicatively coupled to electrical arc fault detector 508. Current sensing subsystem 522 includes, for example, a current sensing inductor, a current sensing transformer, a current sensing resistor, or a Hall Effect sensor. Electrical arc fault detector 508 generates a signal 530, which is communicated to controller 514, in response to detection of an electrical arc occurrence.

Figure 6:
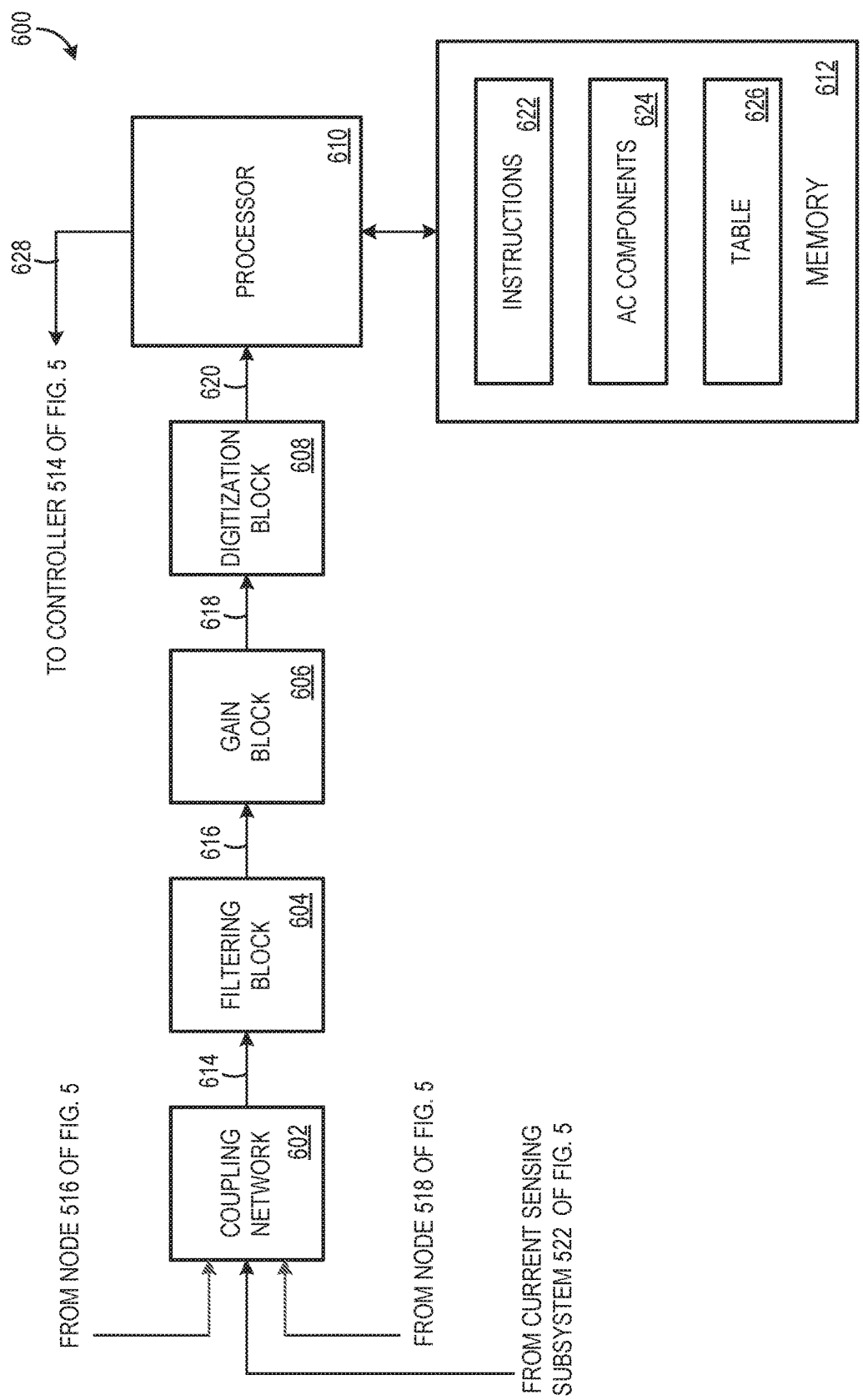
FIG. 6 illustrates one possible embodiment of the electrical arc fault detector of the FIG. 5 photovoltaic assembly.

FIG. 6 illustrates an electrical arc fault detector 600, which is one possible embodiment of electrical arc fault detector 508 and is configured to detect an electrical arc in photovoltaic system 400 from an electrical signal at output port 404. It should be appreciated, however, that electrical arc fault detector 508 is not limited to the embodiment of FIG. 6. Instead, electrical arc fault detector 508 could be embodied in many other manners to detect occurrence of an electrical arc using arc detection techniques known in the art, such as analog arc detection techniques and/or other digital arc detection techniques.

Electrical arc fault detector 600 includes a coupling network 602, a filtering block 604, a gain block 606, a digitization block 608, a processor 610, and a memory 612. Coupling block 602 generates an analog signal 614 representing output voltage $V_{out}$, output port current $I_{out}$, or a combination thereof. In some embodiments, coupling network 602 includes a resistive voltage divider to divide down output port voltage $V_{out}$, or a transformer to step down output port voltage $V_{out}$, to generate analog signal 614 representing output port voltage $V_{out}$. The inputs to coupling network 602 may be varied according to information represented by analog signal 614. For example, in embodiments where analog signal 614 represents only output port voltage $V_{out}$, the input from current sensing subsystem 522, as well as current sensing subsystem 522 itself, may be omitted. As another example, in embodiments where analog signal 614 represents only output port current $I_{out}$, inputs from nodes 516 and 518 may be omitted.

Filtering block 604 filters analog signal 614 to remove AC components not used in detecting an electrical arc, thereby generating filtered analog signal 616. Gain block 606 amplifies filtered analog signal 616 to generate amplified analog signal 618, and digitization block 608 digitizes amplified analog signal 618 to generate digital signal 620 representing amplified analog signal 618. Processor 610 executes instructions 622 in the form of software or firmware stored in memory 612 to decompose digital signal 620 into its constituent AC components 624 using FFT techniques, or other signal detection techniques, and processor 610 stores AC components 624 in memory 612. Additionally, processor 610 executes instructions 622 to compare the frequency of AC components 624 to a predetermined table 626 of frequencies known to indicate occurrence of an electrical arc. If one or more of AC components 624 matches a frequency stored in table 626, processor 610 generates an arc detection signal 628 indicating an electrical arc occurrence. Signal 628 is an embodiment of signal 530 of FIG. 5, and signal 628 is communicatively coupled to controller 514.

In response to electrical arc fault detector 508 generating arc detection signal 530, controller 514 causes injection subsystem 510 to inject one or more signals onto output port 404, for detection by other instances of photovoltaic assembly 402 as an electrical arc or representing an electrical arc. For example, in some embodiments, injection subsystem 510 generates AC signals on output port voltage $V_{out}$, and/or AC signals on output port current $I_{out}$, having frequencies similar to those of an electrical arc. In some other embodiment, injection subsystem 510 injects one or more signals onto output port 404 having frequencies different from those commonly associated with an electrical arc, such as signals having a relatively low frequency, e.g., 50 kHz or lower, to minimize attenuation of the injected signals and/or for ease of implementation of injection subsystem 510. In embodiments where injection subsystem 510 injects signals having frequencies that are different from those commonly associated with an electrical arc, electrical arc fault detector 508 is configured to detect the injected signals, as well as signals associated with an electrical arc. For example, in a particular embodiment, injection subsystem 510 injects signals having a relatively low frequency of 20 kHz onto output port 404 to help minimize signal attenuation, and electrical arc fault detector 508 is configured to detect the 20 kHz signals, as well as higher frequency signals (e.g., ranging from 50 to 150 kHz) commonly associated with an electrical arc.

Electrical arc fault detector 508 of one or more other instances of photovoltaic assembly 402 detects the AC signals generated by injection subsystem 510 as indicating an electrical arc occurrence, and injection subsystems 510 of these other instances of photovoltaic assembly 402 in-turn generate AC signals on their respective output ports 404 representing an electrical arc, such that photovoltaic assemblies 402 communicate the electrical arc occurrence throughout photovoltaic system 400. Such detection of an electrical arc occurrence and re-broadcasting of a signal representing the electrical arc occurrence helps ensure that all instances of photovoltaic assemblies 402 detect the electrical arc occurrence, especially in applications where photovoltaic system 400 is large and an electrical arc is unlikely to be initially detected by each photovoltaic assembly 402 of photovoltaic system 400, or by a centralized electrical arc fault detection device.

FIG. 7 illustrates an injection subsystem 700, which is one possible embodiment of injection subsystem 510. It should be appreciated, however, that injection subsystem 510 may take other forms with departing from the scope hereof. Injection subsystem 700 includes a switching device 702 electrically coupled in series with an impedance element 704, and injection subsystem 700 is electrically coupled in parallel with output port 404. In this document, the term "switching device" refers to an electrical device, or a combination of two or more electrical devices, capable of switching between conductive and non-conductive states, such as a field effect transistor, a bipolar junction transistor, an insulated gate bipolar junction transistor, or an electromechanical relay. Controller 514 causes switching device 702 to switch at a frequency indicating occurrence of an event, such as at frequency simulating an electrical arc, or at relatively low frequency, such as to minimize signal attenuation, to generate corresponding frequency components in output port voltage $V_{out}$ and output port current $I_{out}$, in response to electrical arc fault detector 508 detecting occurrence of the electrical arc. Impedance element 704 includes, for example, one or more resistors to limit magnitude of current through switching device 702, and/or one or more reactive components, such as a capacitor and an inductor, configured to generate desired harmonics of the switching frequency of switching device 702.

Controller 514 also optionally causes shutdown subsystem 512 to shutdown photovoltaic assembly 402 in response to electrical arc fault detector 508 detecting the electrical arc occurrence. In some embodiments, controller 514 does not activate shutdown subsystem 512 until after injection subsystem 510 injects signals onto output port 404, to prevent shutdown subsystem 512 from interfering with operation of injection subsystem 510. Shutdown subsystem 512 includes, for example, a switching device 520 electrically coupled in series with output port 404. Switching device 520 is normally closed, and controller 514 causes switching device 520 to open in response to electrical arc fault detector 508 detecting the electrical arc occurrence, to shut down photovoltaic assembly 402. In some embodiments, controller 514 causes injection subsystem 510 to inject one or more signals onto output port 404 for only a limited time, such as for several seconds, for detection by other instances of photovoltaic assembly 402 as an electrical arc or representing an electrical arc. Controller 514 is optionally further configured to restart photovoltaic assembly 402, such as after a predetermined amount of time from detection of the electrical arc occurrence, or in response to receipt of a reset signal.

Shutdown subsystem 512 could take other forms than that illustrated in FIG. 5 without departing from the scope hereof, such as discussed below with respect to FIGS. 5A and 9. Additionally, in some embodiments, shutdown subsystem 512 shuts down photovoltaic assembly 402 by limiting output voltage $V_{out}$, output current $I_{out}$, and/or power out of output port 404, to a small, but non-zero, value.

In some embodiments, load 408 is capable of detecting an electrical arc occurrence or other abnormality, such as from signals injected by injection subsystems 510 in response to the electrical arc occurrence. Additionally, in embodiments where injection subsystems 510 are configured to inject one or more signals onto output port 404 having frequencies different from those commonly associated with an electrical arc, load 408 is optionally configured to detect signals having such frequencies, in addition to, or instead of, signals associated with an electrical arc. Furthermore, in some embodiments, load 408 is configured to detect presence of an electrical arc, or some other abnormality in photovoltaic system 400, from voltage on power line 406 falling below a predetermined threshold value, magnitude of current flowing through load 408 falling below a predetermined threshold value, and/or power delivered to load 408 falling below a predetermined threshold value, such as might occur when photovoltaic assemblies 402 shut down in response to detecting an electrical arc occurrence. Load 408 is optionally further configured to take action in response to detection of an electrical arc or other abnormality, such as shutting down, communicating occurrence of the electrical arc or other abnormality to an external system, sending one or more signals, such as shutdown command signals, to photovoltaic assemblies 402, and/or ceasing transmission of signals, such as "keep alive" signals, to photovoltaic assemblies 402.

Figure 8A:
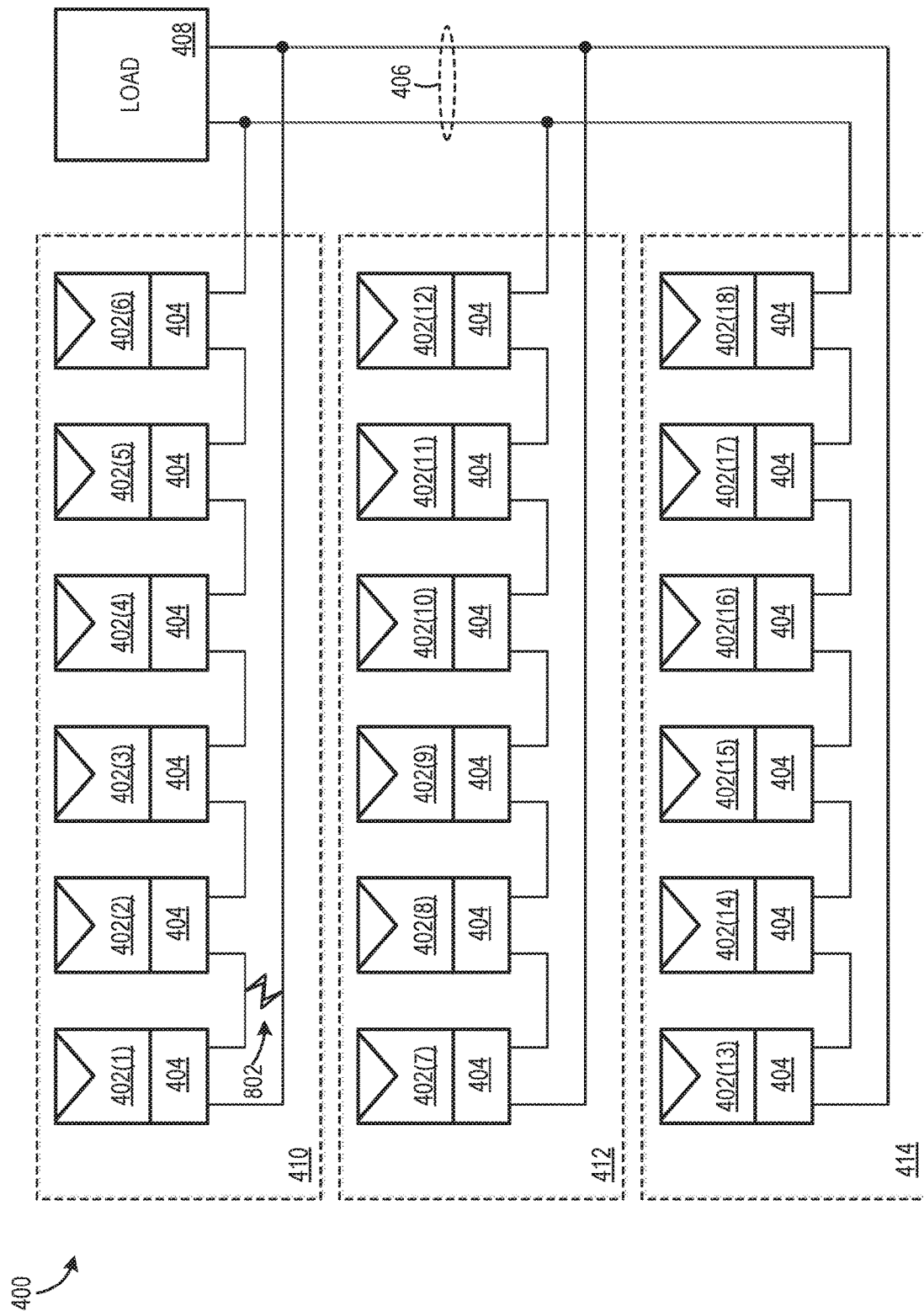
FIGS. 8A-8E collectively illustrate one hypothetical example of a particular embodiment of the FIG. 4 photovoltaic system communicating an electrical arc occurrence.
Figure 8B:
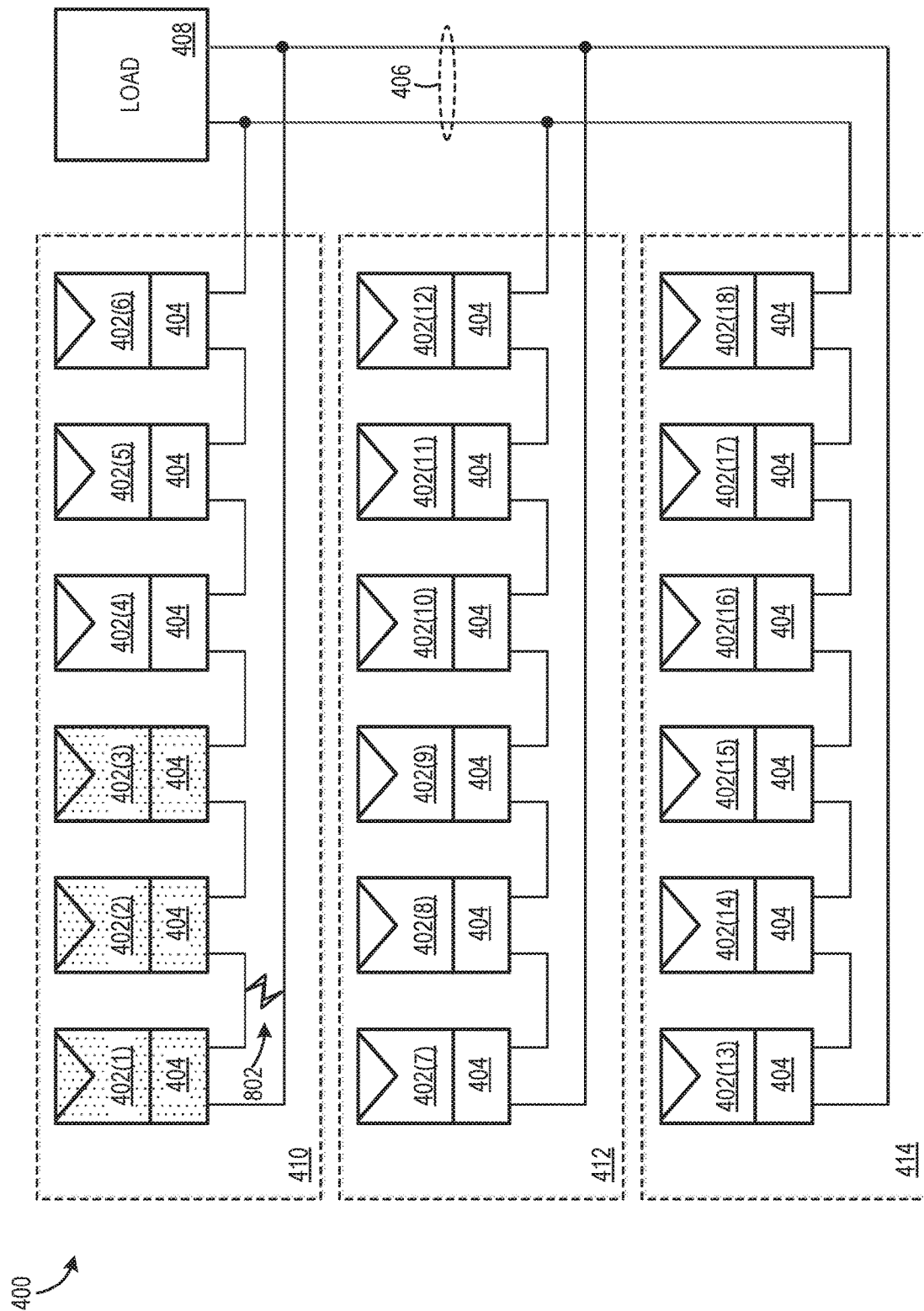
Figure 8C:
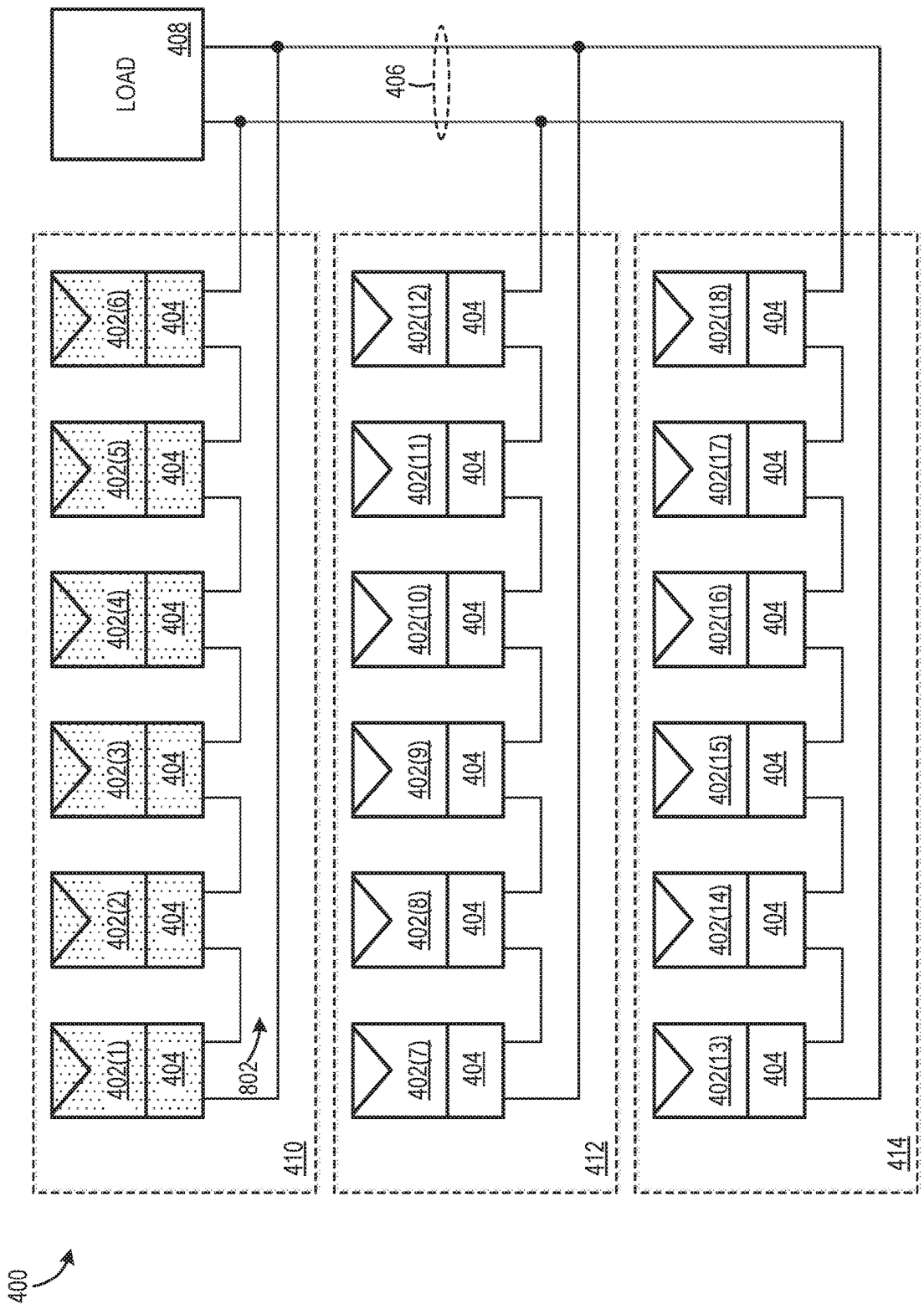
Figure 8D:
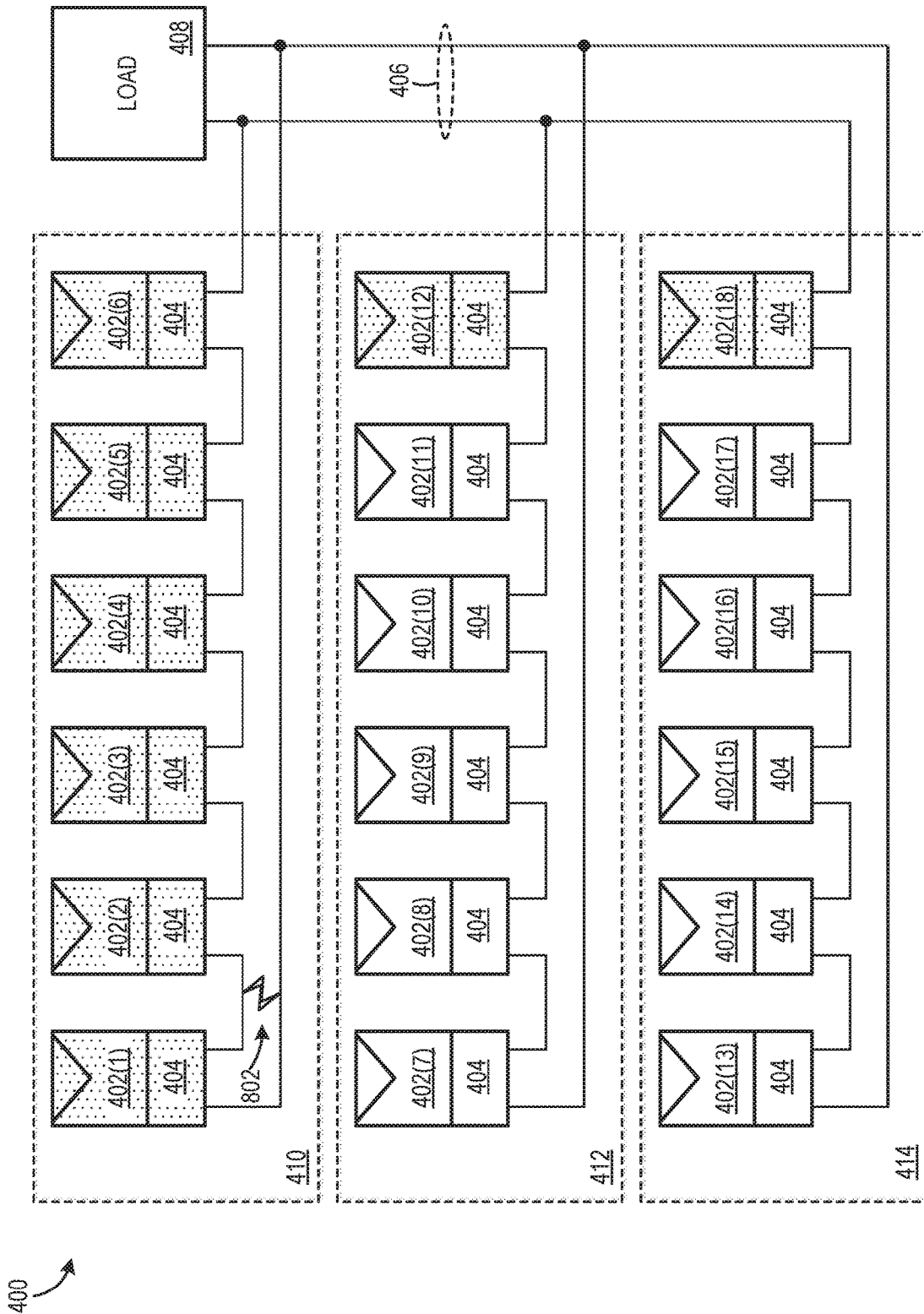
Figure 8E:
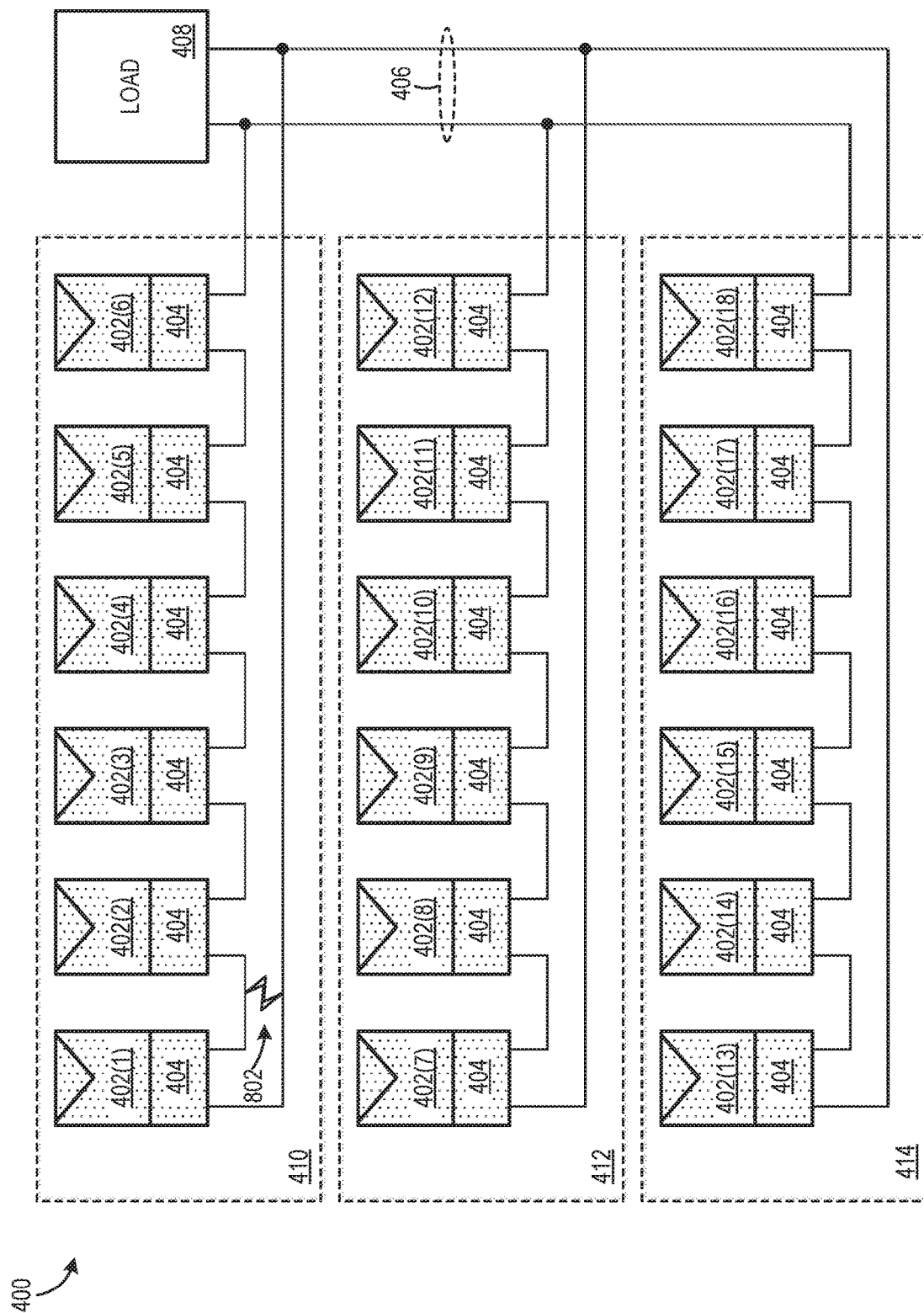

FIGS. 8A-8E collectively illustrate one hypothetical example of a particular embodiment of the FIG. 4 photovoltaic system communicating an electrical arc occurrence. In this example, an electrical arc 802 occurs between photovoltaic assemblies 402(1) and 402(2), as illustrated in FIG. 8A, while photovoltaic assemblies 402 are generating electrical power which is being transmitted to load 408 by power line 406. Photovoltaic assemblies 402(1)-402(3) are sufficiently close to electrical arc 802 that electrical arc fault detectors 508 of photovoltaic assemblies 402(1)-402(3) detect the occurrence of electrical arc 802. In response, injection subsystems 510 of photovoltaic assemblies 402(1)-402(3) inject signals having frequencies simulating an electrical arc on their respective output ports 404. Shut down subsystems 512 of photovoltaic assemblies 402(1)-402(3) also shut down their respective photovoltaic assemblies, as indicated by shading of the photovoltaic assemblies in FIG. 8B, in certain embodiments.

The signals injected by photovoltaic assemblies 402(1)-402(3) into their respective output ports 404 travel along power line 406 to photovoltaic assemblies 402(4)-402(6), such that electrical arc fault detectors 508 of photovoltaic assemblies 402(4)-402(6) detect the injected signals as an electrical arc. In response, injection subsystems 510 of photovoltaic assemblies 402(4)-402(6) also inject signals having frequencies simulating an electrical arc on their respective output ports 404. Shut down subsystems 512 of photovoltaic assemblies 402(4)-402(6) also shut down their respective photovoltaic assemblies, as indicated by shading of the photovoltaic assemblies in FIG. 8C, in particular embodiments.

The signals injected by at least photovoltaic assembly 402(6) into its output port travel along power line 406 to photovoltaic assemblies 402(12) and 402(18), such that electrical arc fault detectors 508 of photovoltaic assemblies 402(12) and 402(18) detect the injected signals as an electrical arc. In response, injection subsystems 510 of photovoltaic assemblies 402(12) and 402(18) inject signals having frequencies simulating an electrical arc on their respective output ports 404. Shut down subsystems 512 of photovoltaic assemblies 402(12) and 402(18) also shut down their respective photovoltaic assemblies, as indicated by shading of the photovoltaic assemblies in FIG. 8D, in some embodiments.

The signals injected by photovoltaic assemblies 402(12) and 402(18) into their respective output ports 404 travel along power line 406 to instances of photovoltaic assemblies 402 which have not yet detected electrical arc 802. Consequently, electrical arc fault detectors 508 of photovoltaic assemblies 402(7)-402(11) and 402(13)-402(17) detect the injected signals as an electrical arc, so that all instances of photovoltaic assemblies 402 have detected the electrical arc 802 directly, or secondarily through the re-broadcast of a signal similar to an electrical arc by injection subsystems 510. Shut down subsystems 512 of photovoltaic assemblies 402(7)-402(11) and 402(13)-402(17) also shut down their respective photovoltaic assemblies, as indicated by shading of the photovoltaic assemblies in FIG. 8E, in certain embodiments. Thus, photovoltaic assemblies 402 communicate occurrence of electrical arc 802 across photovoltaic system 400 by mimicking and "re-broadcasting" the signature of an electrical arc to ensure photovoltaic assemblies distant from electrical arc 802 are able to detect the electrical occurrence and respond thereto.

The hypothetical example of FIGS. 8A-8E should not be construed to suggest that there is a prescribed or necessarily predictable sequence in which an electrical arc occurrence is communicated among photovoltaic assemblies 402. Instead, the manner in which an electrical arc occurrence is communicated among photovoltaic assemblies 402 will vary due to a number of factors, such as the number of photovoltaic assemblies 402 in photovoltaic system 400, the configuration of power line 406, the location and severity of the electrical arc, attenuation of the electrical arc signature across physical connections of power line 406, and the operating conditions and environment of photovoltaic system 400. For example, if electrical arc 802 were to occur near the middle of string 410 instead of near its end, additional and/or different photovoltaic assemblies 402 may directly detect the electrical arc.

In some embodiments, all elements of photovoltaic assembly 402 are commonly packaged, such as in a common photovoltaic module, photovoltaic submodule, or photovoltaic panel. In some other embodiments, at least two elements of photovoltaic assembly 402 are separately packaged. For example, in one particular embodiment, electrical arc fault detector 508, injection subsystem 510, and controller 514 are packaged separately from the remaining elements of photovoltaic assembly 402, such as to enable electrical arc fault detector 508, injection subsystem 510, and controller 514 to be retrofitted into an existing photovoltaic system.

Although FIG. 5 illustrates each of interface circuitry 506, electrical arc fault detector 508, injection subsystem 510, shutdown subsystem 512, and controller 514 being separate elements, two or more of these elements may be at least partially combined without departing from the scope hereof. For example, photovoltaic assembly 402 could be modified such that both injection subsystem 510 and shutdown subsystem 512 are embodied by switching device 520. In this particular alternate embodiment, switching device 520 is normally closed, and controller 514 causes switching device 520 to switch at a frequency simulating an electrical arc, or at a relatively low frequency, to generate corresponding frequency components in output port voltage $V_{out}$ and output port current $I_{out}$, in response to electrical arc fault detector 508 detecting the electrical arc occurrence. Additionally, controller 514 also optionally causes switching device 520 to remain in its open state after performing the aforementioned switching, to shut down photovoltaic assembly 402 in response to electrical arc fault detector 508 detecting the electrical arc occurrence.

Figure 5A:
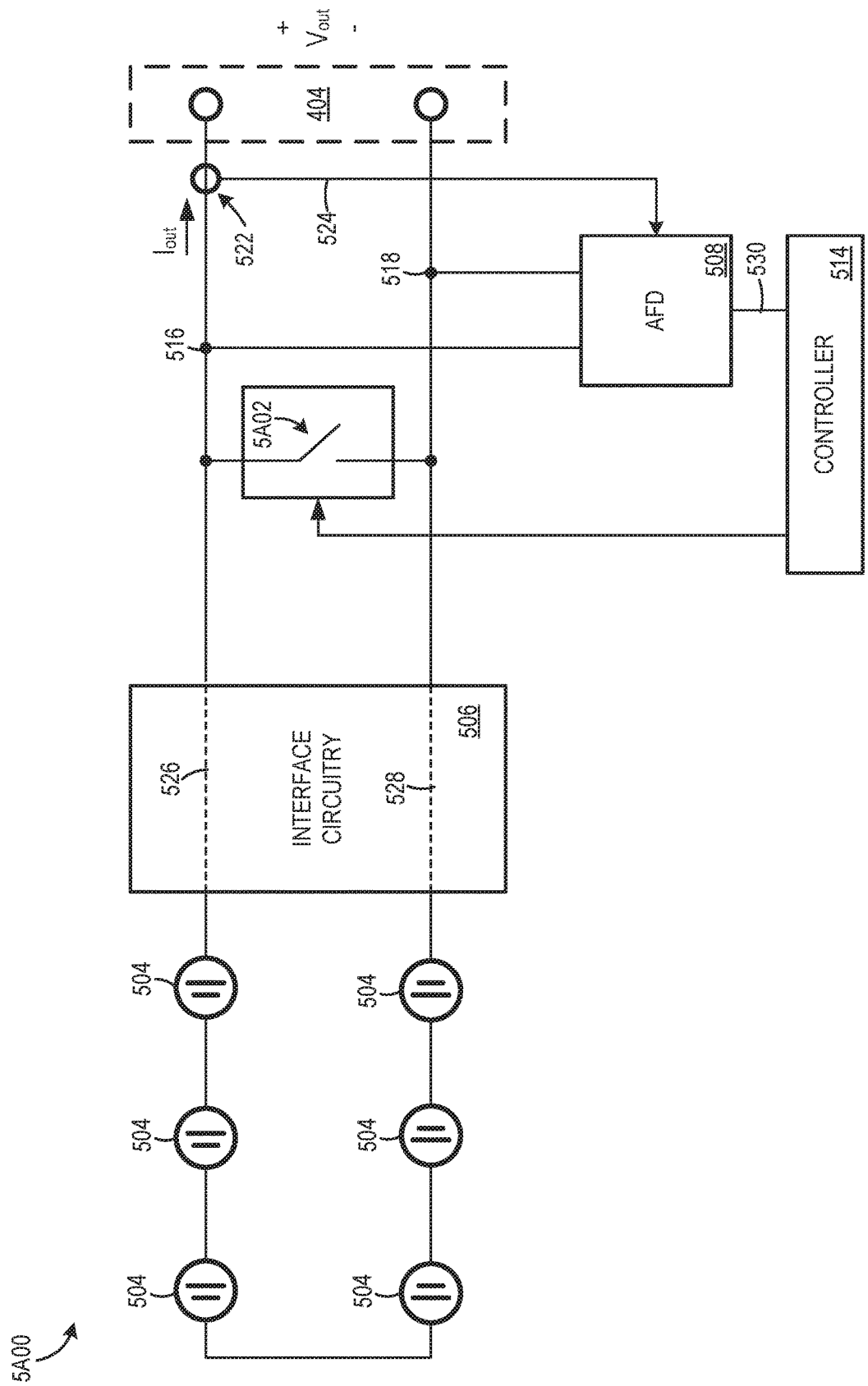
FIG. 5A illustrates a photovoltaic assembly similar to that of FIG. 5, but with an injection subsystem and a shutdown subsystem embodied by a single switching device electrically coupled across an output port, according to an embodiment.

As another example of how elements of photovoltaic assemblies can be combined, FIG. 5A illustrates a photovoltaic assembly 5A00, which is similar to photovoltaic assembly 402, but with injection subsystem 510 and shutdown subsystem 512 embodied by a switching device 5A02 electrically coupled across output port 404 between positive output power node 516 and reference power node 518. Switching device 5A02 could alternately be disposed on the right side of output port 404, instead of on the left side of output port 404. Photovoltaic assemblies 5A00 are used, for example, in place of photovoltaic assemblies 402 in photovoltaic system 400 of FIG. 4. Switching device 5A02 is normally open, and controller 514 causes switching device 5A02 to switch at a frequency simulating an electrical arc, or at a relatively low frequency, such as to minimize signal attenuation and/or to promote ease of implementation of the injection subsystem, to generate corresponding frequency components in output port voltage $V_{out}$ and output port current $I_{out}$, in response to electrical arc fault detector 508 detecting the electrical arc occurrence. Additionally, controller 514 also optionally causes switching device 5A02 to remain in its closed state after performing the aforementioned switching, to short photovoltaic devices 504 and thereby shut down photovoltaic assembly 5A00 in response to electrical arc fault detector 508 detecting the electrical arc occurrence. An impedance element similar to impedance element 704 of FIG. 7 is optionally electrically coupled in series with switching device 5A02.

Figure 9:
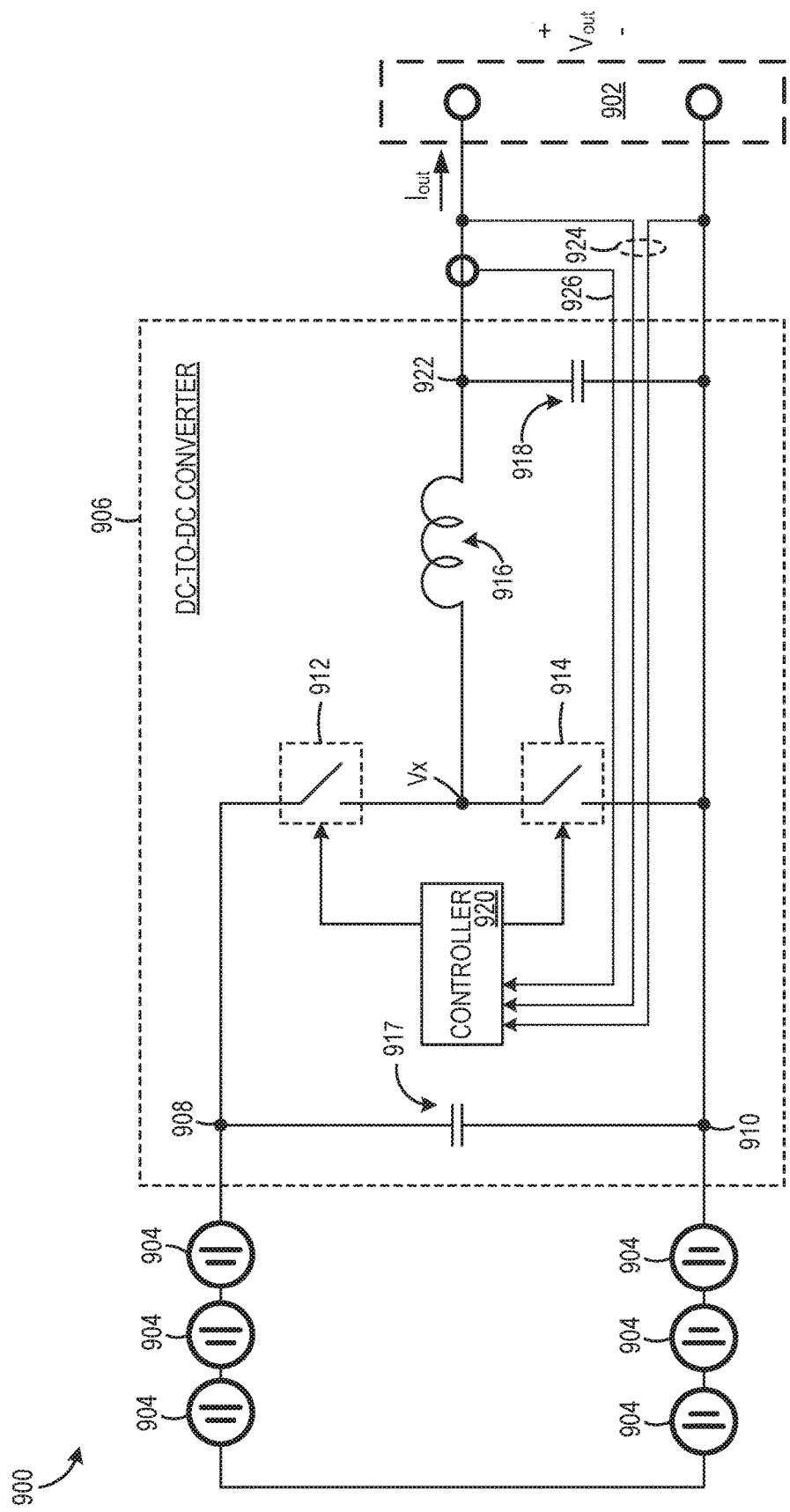
FIG. 9 illustrates an alternate embodiment of a photovoltaic assembly with multiple elements embodied by a DC-to-DC converter.

As yet another example of how elements of photovoltaic devices can be combined, FIG. 9 illustrates a photovoltaic assembly 900, which is an alternate embodiment of photovoltaic assembly 402 with interface circuitry, an electrical arc fault detector, an injection subsystem, and a shutdown subsystem embodied by a DC-to-DC converter 906. Photovoltaic assemblies 900 are used, for example, in place of photovoltaic assemblies 402 in photovoltaic system 400 of FIG. 4.

Each photovoltaic assembly 900 includes an output port 902, one or more photovoltaic cells 904, and DC-to-DC converter 906 electrically interfacing photovoltaic cells 904 with output port 902. Photovoltaic cells 904 are electrically coupled between a positive input power node 908 and a reference power node 910 of photovoltaic assembly 900. Photovoltaic cells 904 are, for example, crystalline silicon solar cells or thin-film solar cells, and photovoltaic cells 904 may be single-junction or multi-junction photovoltaic cells. Each solar cell 904 need not necessarily have the same configuration. Although FIG. 9 illustrates photovoltaic assembly 900 as including six photovoltaic cells 904 electrically coupled in series, the number of photovoltaic cells 904 and their electrical interconnection topology may be varied without departing from the scope hereof. For example, photovoltaic assembly 900 could be modified to include only a single photovoltaic cell 904 electrically interfaced to output port 902 by DC-to-DC converter 906. As another example, photovoltaic assembly 900 could be modified to include an array of photovoltaic cells 904 electrically coupled in series and/or parallel, where the array is electrically interfaced to output port 902 by DC-to-DC converter 906. Accordingly, each photovoltaic assembly 900 is, for example, a photovoltaic panel, a photovoltaic module of a photovoltaic panel, or a submodule of a photovoltaic module.

DC-to-DC converter 906 has a buck-type topology and includes a first switching device 912, a second switching device 914, an inductor 916, an input capacitor 917, an output capacitor 918, and a controller 920. First switching device 912 is electrically coupled between positive input power node 908 and a switching node Vx, and second switching device 914 is electrically coupled between switching node Vx and reference power node 910. Inductor 916 is electrically coupled between switching node Vx and a positive output node 922. Input capacitor 917 is electrically coupled between positive input power node 908 and reference power node 910. Output capacitor 918 and output port 902 are each electrically coupled between positive output power node 922 and reference power node 910. In some alternate embodiments, such as in embodiments where a circuit including power line 406 has significant inductance, inductor 916 and capacitor 918 are omitted, and DC-to-DC converter 906 relies on interconnection inductance of a circuit including output port 902 for energy storage inductance.

Controller 920 is configured to cause DC-to-DC converter 906 to operate in at least two different operating modes. In a first operating mode, corresponding to normal operation of photovoltaic assembly 900, controller 920 causes first switching device 912 to repeatedly switch between its conductive and non-conductive states to transfer electrical power between photovoltaic cells 904 and circuitry electrically coupled to output port 902, such as load 408 (FIG. 4). Controller 920 also causes second switching device 914 to repeatedly switch between its conductive and non-conductive states to perform a freewheeling function, or in other words, to provide a path for current flowing through output port 902 when first switching device 912 is in its non-conductive state. Additionally, in some embodiments, controller 920 is configured to control switching of first switching device 912 to perform MPPT, or in other words, such that photovoltaic cells 904 operate at least substantially at their maximum power point, using MPPT techniques known in the art. In some embodiments, controller 920 controls switching of first switching device 912 and second switching device 914 using pulse width modulation (PWM) or pulse frequency modulation (PFM) techniques.

Additionally, controller 920 is configured to operate DC-to-DC converter 906 to implement the functions of electrical arc fault detector 508 and injection subsystem 510, and in some embodiments, controller 920 is further configured to operate DC-to-DC converter 906 to implement the functions of shutdown subsystem 512. In particular, controller 920 is configured to monitor voltage $V_{out}$ across output port 902 via voltage feedback path 924, and/or current $I_{out}$ flowing through output port 902 via current feedback path 926, to detect an electrical arc occurrence, such as an electrical arc along power line 406 or an electrical arc within a photovoltaic assembly 900 instance, to implement functionality of electrical arc fault detector 508. In some embodiments, controller 920 includes blocks similar to those of electrical arc fault detector 600 (FIG. 6) for detecting an electrical arc. Furthermore, controller 920 is configured to cause first switching device 912 to switch at a frequency simulating an electrical arc, to generate corresponding frequency components in output port voltage $V_{out}$ and output port current $I_{out}$, in response to detecting an electrical arc occurrence, to implement functionality of injection subsystem 510. Moreover, controller 920 is optionally further configured to cause first switching device 912 and second switching device 914 to continuously operate in their non-conductive states in response to controller 920 detecting an electrical arc occurrence, thereby shutting down photovoltaic assembly 900 and implementing functionality of shutdown system 512. In some alternate embodiments, controller 920 is configured to cause first switching device 912 and second switching device 914 to continuously operate in their conductive states in response to controller 920 detecting an electrical arc occurrence, to electrically short photovoltaic cells 904 and thereby shut down photovoltaic assembly 900.

In some embodiments, all elements of photovoltaic assembly 900 are commonly packaged, such as in a common photovoltaic module, photovoltaic submodule, or photovoltaic panel. In some other embodiments, at least two elements of photovoltaic assembly 900 are separately packaged. For example, in one particular embodiment, photovoltaic cells 904 are packaged separately from the remaining elements of photovoltaic assembly 900.

Modifications may be made to DC-to-DC converter 906 without departing from the scope hereof. For example, in some alternate embodiments, controller 920 is configured to cause first switching device 912 to switch in a manner which generates low frequency components in output port voltage $V_{out}$ and output port current $I_{out}$, in response to controller 920 detecting an electrical arc occurrence, to implement functionality of injection subsystem 510. For example, in a particular embodiment, controller 920 varies duty cycle or frequency of first switching device 912 in a low frequency manner to inject low frequency signals onto output port 902, in response to controller 920 detecting an electrical arc occurrence. Varying output port voltage $V_{out}$ and output port current $I_{out}$ at a low frequency, instead of at a frequency simulating an electrical arc, advantageously helps minimize local and/or system-wide attenuation of corresponding signals. Local attenuation of the signals occurs within photovoltaic assembly 900, such as from presence of an LC filter formed by inductor 916 and output capacitor 918. System-wide attenuation of the signals, on the other hand, occurs in a system incorporating photovoltaic assemblies 900, such as from inductance of a circuit connecting output ports 902 to a load. Controller 920 must be configured to detect low frequency signals at output port 902, as well as higher frequencies corresponding to an electrical arc, in embodiments where controller 920 causes first switching device 912 to switch in a manner which generates low frequency components in output port voltage $V_{out}$ and output port current $I_{out}$ in response to controller 920 detecting an electrical arc occurrence.

As another example of a possible modification to DC-to-DC converter 906, positions of first switching device 912 and second switching device 914 could be swapped, with appropriate changes to controller 920, so that DC-to-DC converter 906 has an inverted buck-type topology. As yet another example of a possible modification to DC-to-DC converter 906, the converter could be modified to have a boost-type topology, or a buck-boost-type topology, with appropriate changes to controller 920.

Figure 10:
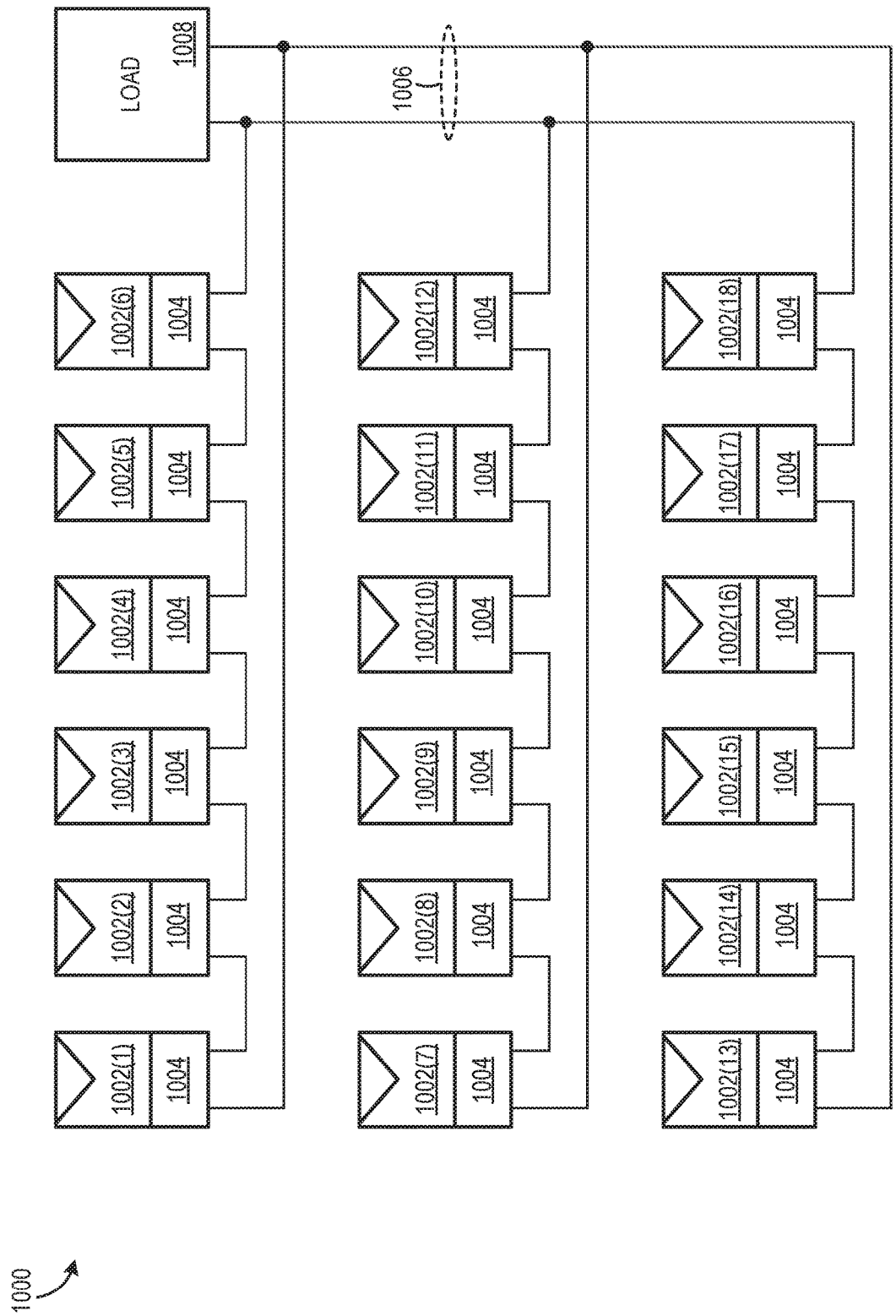
FIG. 10 illustrates a photovoltaic system similar to that of FIG. 4, but where each photovoltaic assembly is further able to communicate via a power line communication network, according to an embodiment.

Elements of the photovoltaic assemblies disclosed herein are optionally shared with one or more other subsystems, to promote economy and/or small photovoltaic assembly size. For example, FIG. 10 illustrates a photovoltaic system 1000 including a plurality of photovoltaic assemblies 1002, where each photovoltaic assembly 1002 is capable of communicating an electrical arc occurrence within photovoltaic system 1000, in a manner similar to that discussed above with respect to FIGS. 4-9. Additionally, each photovoltaic assembly 1002 in system 1000 is further configured to communicate with an external device, such as a load 1008, via a power line communication (PLC) network.

Each photovoltaic assembly 1002 has a respective output port 1004, and each output port 1004 is electrically coupled to a common power line 1006. A load 1008, such as an inverter or a battery charger, is optionally electrically coupled to power line 1006. The number of photovoltaic assemblies 1002, and the electrical topology of their interconnection in photovoltaic system 1000, may be varied without departing from the scope hereof. For example, photovoltaic system 1000 could be modified to have a different number of strings, including only a single string, or to have a different number of photovoltaic assemblies 1002 within a string, without departing from the scope hereof.

Figure 11:
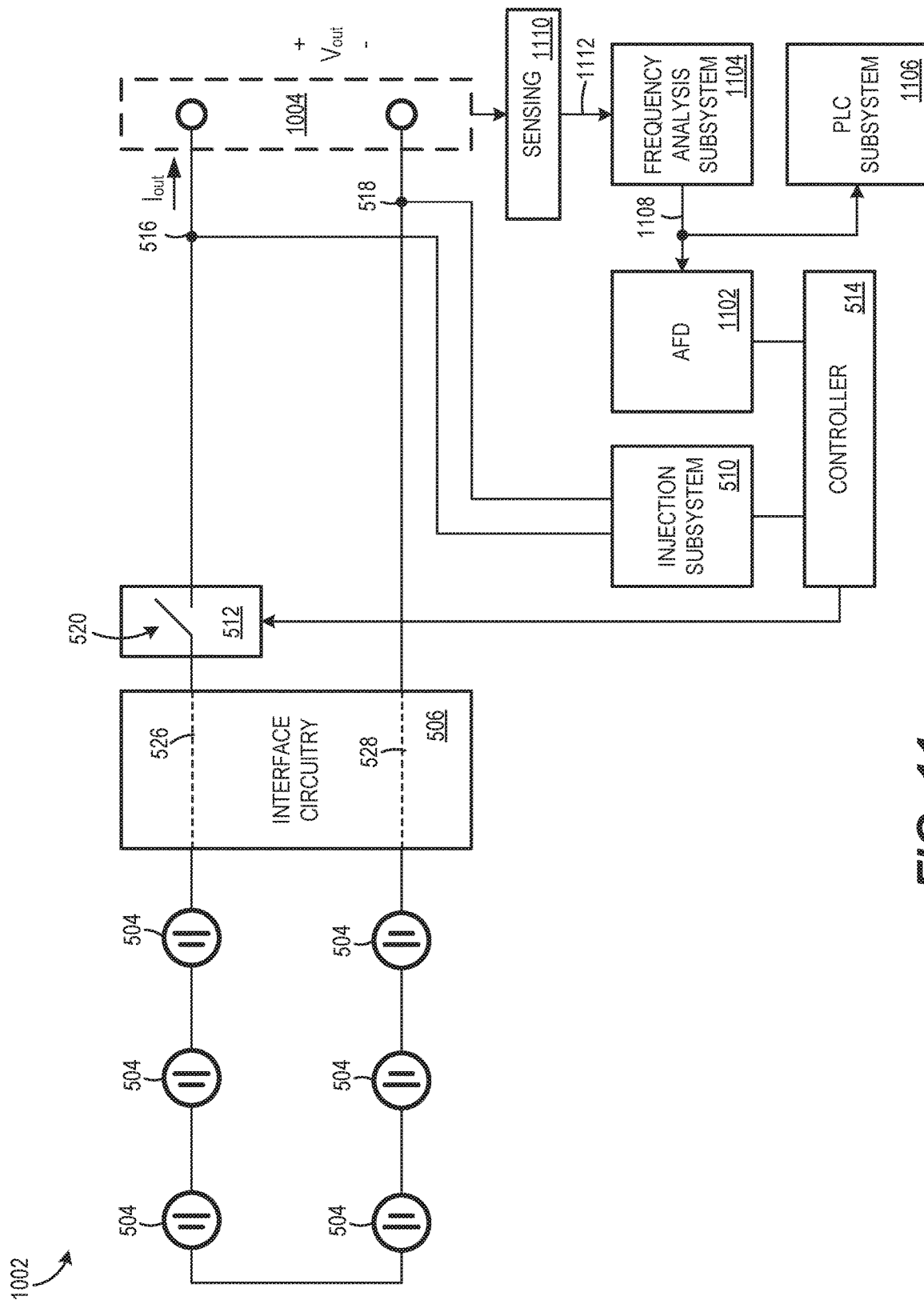
FIG. 11 illustrates one instance of the FIG. 10 photovoltaic assemblies in greater detail.

FIG. 11 illustrates an instance of photovoltaic assembly 1002 in greater detail. Each photovoltaic assembly 1002 includes one or more photovoltaic cells 504, interface circuitry 506, an electrical arc fault detector 1102, an injection subsystem 510, an optional shutdown subsystem 512, a controller 514, a frequency analysis subsystem 1104, a power line communication subsystem 1106, and a sensing subsystem 1110. Photovoltaic cells 504, interface circuitry 506, injection subsystem 510, shutdown system 512, and controller 514 have the same configuration and operation as discussed above.

Sensing subsystem 1110 generates an output port signal 1112 representing electrical signals at output port 1004, i.e., voltage $V_{out}$, output current $I_{out}$, or a combination thereof. Accordingly, in some embodiments, sensing subsystem 1110 includes one or more of a transformer for sensing voltage $V_{out}$ or current $I_{out}$, a resistive voltage divider for dividing down voltage $V_{out}$, a current sensing resistor, a current sensing inductor, and a Hall Effect sensor. Frequency analysis subsystem 1104 decomposes output port signal 1112 into its constituent AC components 1108 using FFT techniques, frequency demodulation, or other techniques. Power line communication subsystem 1106 is configured to obtain communication data, such as a shutdown or "keep alive" command generated by load 1008, from constituent AC components 1108, using power line communication techniques known in the art. Electrical arc fault detector 1102 is configured to detect an electrical arc occurrence in electrical circuitry coupled to output port 1004 from constituent AC components 1108, such using techniques similar to those discussed above with respect to processor 610 and memory 612 of FIG. 6. Thus, both electrical arc fault detector 1102 and power line communication subsystem 1106 share frequency analysis subsystem 1104 and sensing subsystem 1110, thereby promoting low cost and small size of photovoltaic assembly 1002.

Although the present embodiments are primarily discussed above with respect to the event being an electrical arc, the present embodiments are not limited to communicating an electrical arc occurrence. Instead, a different type of event occurrence could be communicated within a photovoltaic system by injecting onto a power line a signal having a frequency not present during normal photovoltaic system operation, such as a signal simulating an electrical arc occurrence. Such signal is optionally detected and re-broadcasted by one or more other photovoltaic assemblies of the photovoltaic system, such as in a manner similar to that discussed above with respect to FIGS. 8A-8E. For example, occurrence of one or more events such as generation of an abnormal status code by a photovoltaic system element, an over-temperature condition within the photovoltaic system, an abnormally high positive or negative current magnitude within the photovoltaic system, frequent or persistent bypass diode conduction, abnormally high or low voltage magnitude between nodes of the photovoltaic system, and/or an abnormally high impedance magnitude within the photovoltaic system, could be communicated using variations of the systems and methods disclosed herein.

In embodiments capable of communicating the occurrence of two or more different types of events, signals representing each event are optionally injected onto a power line at different respective frequencies for each event, to enable the type of event to be ascertained from the frequency of the injected signal. For example, in one alternate embodiment of photovoltaic assembly 402 capable of communicating occurrence of either an electrical arc occurrence or an over-temperature condition occurrence, controller 514 is configured to cause injection subsystem 510 to (1) inject signals onto output port 404 having a first frequency in response to detection of an electrical arc occurrence, and (2) inject signals onto output port 404 having a second frequency in response to detection of an over-temperature condition occurrence. In this particular embodiment, the first frequency is different from the second frequency, and the type of event, i.e., an electrical arc occurrence or an over-temperature condition, can be determined from the frequency of the injected signals.

Figure 12:
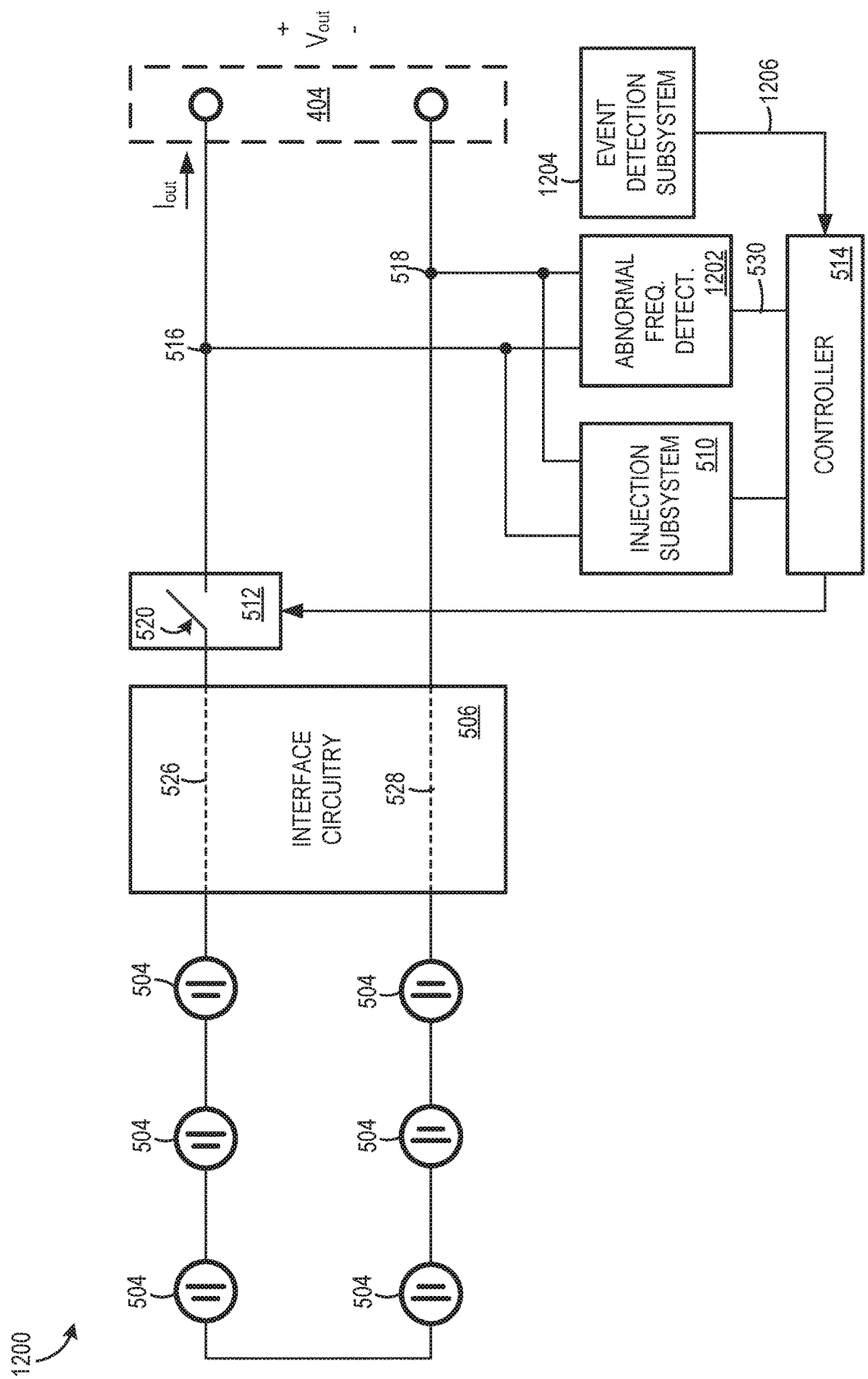
FIG. 12 illustrates a photovoltaic assembly like that of FIG. 5, but configured to detect and communicate occurrence of an event other than, or in addition to, an electrical arc occurrence, according to an embodiment.

FIG. 12 illustrates a photovoltaic assembly 1200, which is like photovoltaic assembly 402 of FIG. 5, but is configured to detect and communicate occurrence of an event other than, or in addition to, an electrical arc occurrence. Photovoltaic assemblies 1200 are used, for example, in place of photovoltaic assemblies 402 in photovoltaic system 400 of FIG. 4.

Photovoltaic assembly 1200 includes one or more photovoltaic cells 504, interface circuitry 506, an injection subsystem 510, a shutdown subsystem 512, a controller 514, an abnormal frequency detector 1202, and an event detection subsystem 1204. Photovoltaic cells 504, interface circuitry 506, injection subsystem 510, shutdown system 512, and controller 514 have the same configuration and operation as discussed above. Event detection subsystem 1204 detects occurrence of one or more events, such as generation of an abnormal status code by a photovoltaic system element, an over-temperature condition within the photovoltaic system, an abnormally high positive or negative current magnitude within the photovoltaic system, frequent or persistent bypass diode conduction, abnormally high or low voltage magnitude between nodes of the photovoltaic system, and/or an abnormally high impedance magnitude within the photovoltaic system. Accordingly, in some embodiments, event detection subsystem 1204 includes one or more of (1) a communication port for receiving and detecting an abnormal status code, (2) a temperature sensing device for detecting an over-temperature condition, (3) a current sensing device for detecting abnormally high positive or negative current magnitude, (4) a device configured to detect voltage across and/or of current through a diode, for detecting frequent or persistent bypass diode conduction, (5) voltage sensing circuitry for detecting abnormally high or low voltage magnitude between nodes of a photovoltaic system, and (6) impedance sensing circuitry for detecting abnormally high impedance magnitude within a photovoltaic system. Event detection subsystem 1204 generates an event signal 1206 in response to detection of an event.

In response to event detection subsystem 1204 generating event signal 1206, controller 514 causes injection subsystem 510 to inject one or more signals onto output port 404 for detection by other instances of photovoltaic assembly 402 as representing an event occurrence. Event detection subsystem 1202 detects an event condition occurrence from presence of frequencies at output port 404 that are not present during normal operation, i.e., from electrical signals at output port 404 having the same frequency as those injected by injection subsystem 510 of another photovoltaic assembly 1200 instance. Accordingly, an event occurrence detected by one instance of photovoltaic assembly 1200 is communicated to other instances of photovoltaic assembly 1200, such as in a manner similar to that of the hypothetical example of FIGS. 8A-8E. Controller 514 optionally causes shutdown subsystem 512 to shutdown photovoltaic assembly 1200 in response to event detector 1202 detecting the event occurrence. In some embodiments, controller 514 does not activate shutdown subsystem 512 until after injection subsystem 510 injects signals onto output port 404, to prevent shutdown subsystem 512 from interfering with operation of injection subsystem 510.

In certain embodiments, event detection subsystem 1202 detects signals indicating an event occurrence using techniques similar to those conventionally used for electrical arc fault detection. Indeed, in embodiments where controller 514 causes injection subsystem 510 to inject signals having a frequency associated with an electrical arc, abnormal frequency detector 1202 could be implemented by an electrical arc fault detector.

Photovoltaic assembly 1200 could modified to omit injection subsystem 510 in embodiments where it not necessary to re-broadcast occurrence of the-event occurrence. Additionally, a photovoltaic system could be formed of a mixture of embodiments of photovoltaic assembly 1200 including injection subsystem 510 and embodiments of photovoltaic assembly 1200 not including injection subsystem 510, such as in applications where it is necessary for only some photovoltaic assemblies of the photovoltaic system to have capability to re-broadcast the event occurrence.

Figure 13:
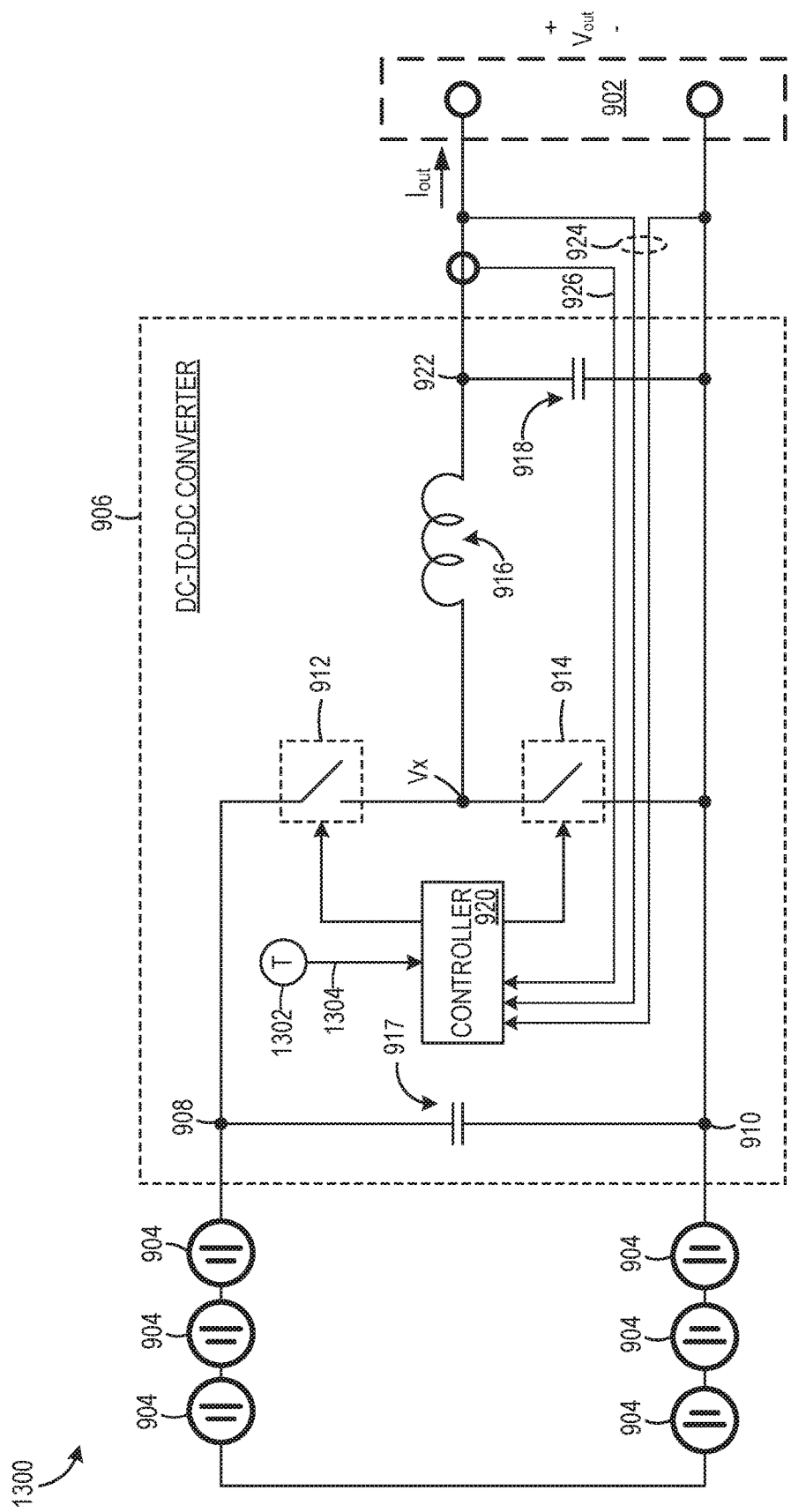
FIG. 13 illustrates a photovoltaic assembly like that of FIG. 9, but configured to detect and communicate occurrence of an over-temperature condition, as well as occurrence of an electrical arc, according to an embodiment.
Figure 14:
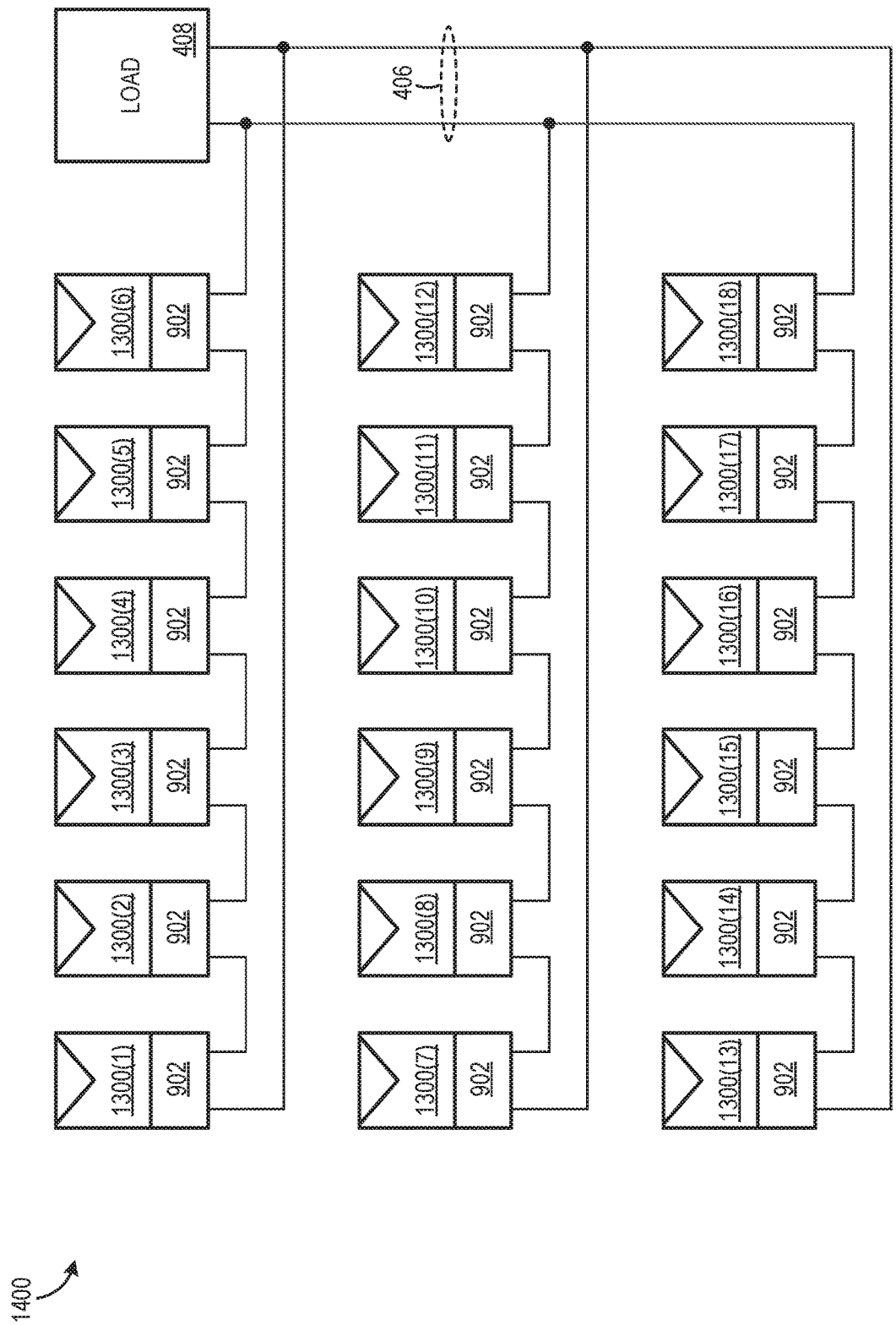
FIG. 14 illustrates a photovoltaic system including a plurality of the FIG. 13 photovoltaic assemblies, according to an embodiment.

FIG. 13 illustrates another example of how the systems and methods disclosed herein could be modified to communicate occurrence of one or more abnormalities in addition to an electrical arc. In particular, FIG. 13 illustrates a photovoltaic assembly 1300, which is similar to photovoltaic assembly 900 of FIG. 9, but further includes a temperature sensor 1302. Photovoltaic assemblies 1300 are used, for example, in place of photovoltaic assemblies 402 in photovoltaic system 400 of FIG. 4. For example, FIG. 14 illustrates a photovoltaic system 1400 like photovoltaic system 400 of FIG. 4, but with photovoltaic assemblies 402 substituted with photovoltaic assemblies 1300.

Photovoltaic assembly 1300 includes the same functionality as photovoltaic assembly 900 of FIG. 9. For example, photovoltaic assembly 1300 is configured to detect and communicate an electrical arc occurrence in the same manner as photovoltaic assembly 900. Additionally, photovoltaic assembly 1300 is further capable of detecting and communicating occurrence of an over-temperature condition in the photovoltaic assembly. Specifically, temperature sensor 1302 generates an over-temperate signal 1304 in response to temperature of photovoltaic assembly 1300 exceeding a predetermined threshold value. Controller 920 is configured to cause first switching device 912 to switch at a frequency representing occurrence of the over-temperature condition, to generate corresponding frequency components in output port voltage $V_{out}$ and output port current $I_{out}$, in response to temperature sensor 1302 generating over-temperature signal 1304, thereby injecting a signal onto output port 902 communicating the over-temperature condition occurrence.

In some embodiments, controller 920 causes first switching device 912 to switch at the same frequency in response to occurrence of either an electrical arc or an over-temperature condition. While this configuration promotes simplicity of photovoltaic assembly 1300, a given instance of photovoltaic assembly 1300 detecting a signal generated by another photovoltaic assembly 1300 instance will be unable to tell if the detected signal represents an electrical arc occurrence or an over-temperature condition occurrence, as signals generated in response to either event have the same frequency. In some other embodiments, however, controller 920 causes first switching device 912 to switch at a first frequency in response to an electrical arc occurrence and at a second frequency in response to an over-temperature condition occurrence, where the second frequency is different from the first frequency, so that the type of event, i.e., an electrical arc occurrence or an over-temperature condition, can be determined from the frequency of the injected signals.

Photovoltaic assembly 1300 could be modified to detect and communicate alternative or additional events without departing from the scope hereof. For example, temperature sensor 1302 could be replaced with another type of sensor, such as an over-voltage sensor, so that photovoltaic assembly 1300 is configured to detect and communicate occurrence of an over-voltage condition, instead of an over-temperature condition. As another example, photovoltaic assembly 1300 could be modified to include an over-current sensor in addition to temperature sensor 1302, such that photovoltaic assembly 1300 is configured to detect and communicate occurrence of any one of an over-current condition, an over-temperature condition, and an electrical arc.

Figure 15:
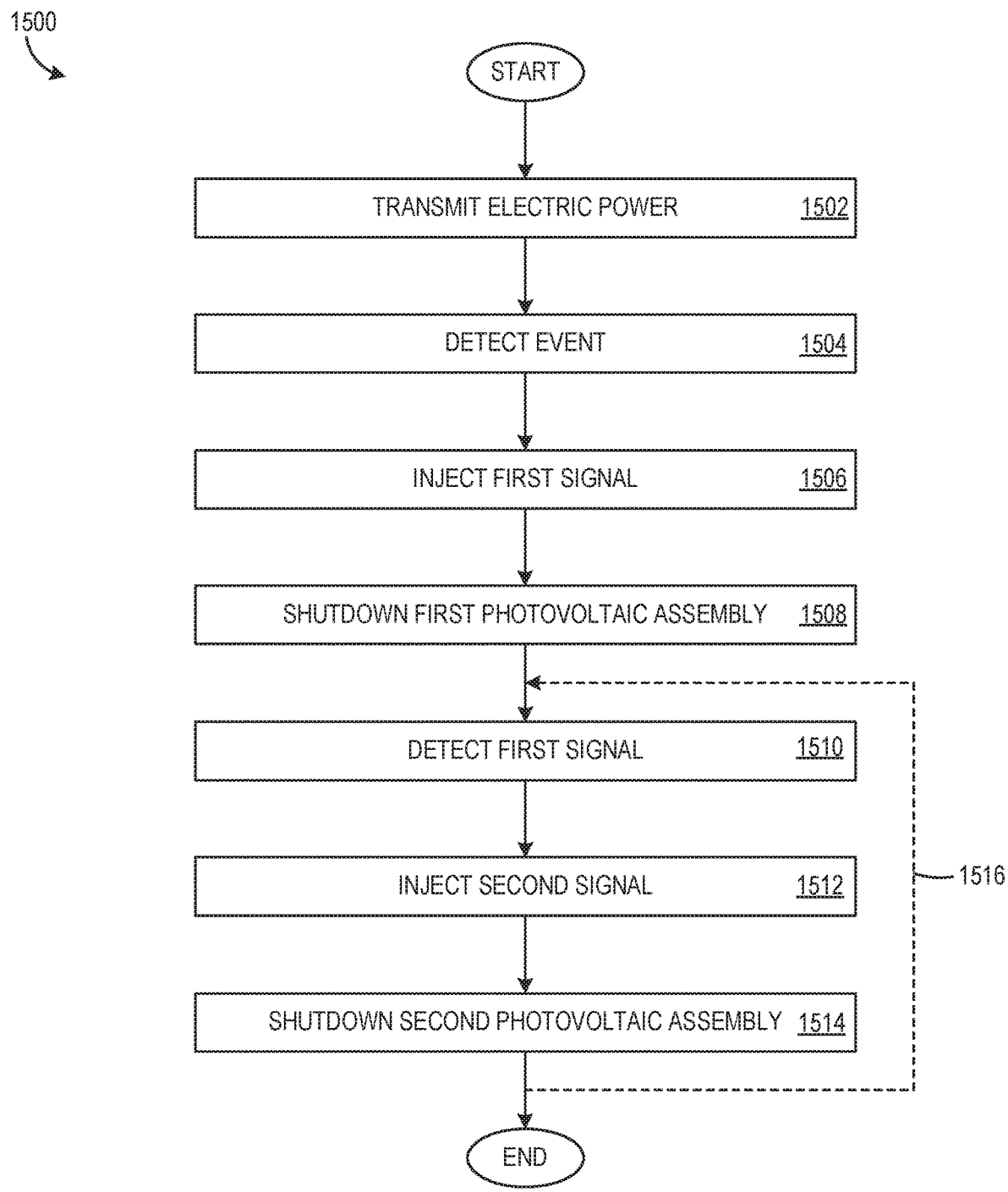
FIG. 15 illustrates a method for communicating an event occurrence among a plurality of photovoltaic assemblies of a photovoltaic system, according to an embodiment.

FIG. 15 illustrates a method 1500 for communicating an event occurrence among a plurality of photovoltaic assemblies of a photovoltaic system. In step 1502, electrical power is transmitted from the plurality of photovoltaic assemblies to a load via a power line. In one example of step 1502, power line 406 transmits electrical power from photovoltaic assemblies 402 to load 408 (FIG. 4). In another example of step 1502, power line 406 transmits electrical power from photovoltaic assemblies 1300 to load 408 (FIG. 14). In step 1504, the event is detected. In one example of step 1504, electrical arc fault detector 508 of photovoltaic assembly 402(2) detects electrical arc 802 occurrence in photovoltaic system 400 (FIGS. 4, 5, and 8A). As another example of step 1504, controller 920 of photovoltaic assembly 1300(2) (FIGS. 13 and 14) detects occurrence of either an electrical arc or an over-temperature condition. In step 1506, a first signal is injected onto the power line at a first photovoltaic assembly of the plurality of photovoltaic assemblies, in response to the event occurrence. In one example of step 1506, photovoltaic assembly 402(2) injects a signal onto power line 406 via its output port 404, in response to detection of electrical arc 802 by electrical arc fault detector 508 of photovoltaic assembly 402(2). In another example of step 1506, photovoltaic assembly 1300(2) injects a signal onto power line 406 via its output port 902, in response to detection of either an electrical arc or an over-temperature condition by controller 920. In step 1508, which is optional, the first photovoltaic assembly is shut down. In one example of step 1508, shutdown subsystem 512 of photovoltaic assembly 402(2) shuts down photovoltaic assembly 402(2). In another example of step 1508, controller 920 of photovoltaic assembly 1300(2) shuts down photovoltaic assembly 1300(2).

In step 1510, the first signal is detected on the power line at a second photovoltaic assembly of the plurality of photovoltaic assemblies. In one example of step 1510, photovoltaic assembly 402(4) detects the signal injected by injection subsystem 510 of photovoltaic assembly 402(2) in step 1506. In another example of step 1510, photovoltaic assembly 1300(4) detects the signal injected by controller 920 and first switching device 912 of photovoltaic assembly 1302(2) in step 1506. In step 1512, a second signal is injected onto the power line at the second photovoltaic assembly, in response to detection of the first signal on the power line at the second photovoltaic assembly. In one example of step 1512, photovoltaic assembly 402(4) injects a signal onto power line 406 via its output port 404, in response to detection of the signal injected by injection subsystem 510 of photovoltaic assembly 402(2) in step 1510. In another example of step 1512, photovoltaic assembly 1300(4) injects a signal onto power line 406 via its output port 902, in response to detection of the signal injected by controller 920 and first switching device 912 of photovoltaic assembly 1302(2) in step 1510.

In step 1514, which is optional, the second photovoltaic assembly is shut down. In one example of step 1514, shutdown subsystem 512 of photovoltaic assembly 402(4) shuts down photovoltaic assembly 402(4). In another example of step 1514, controller 920 of photovoltaic assembly 1300(4) shuts down photovoltaic assembly 1300(4). Steps 1510-1514 are optionally repeated 1216 for additional photovoltaic assemblies in the photovoltaic system.

Combinations of Features

Features described above may be combined in various ways without departing from the scope hereof. The following examples illustrate some possible combinations:

(A1) A method for communicating an event occurrence among a plurality of photovoltaic assemblies of a photovoltaic system may include the following steps: (1) in response to the event occurrence, injecting a first signal onto a power line at a first photovoltaic assembly of the plurality of photovoltaic assemblies, (2) detecting the first signal on the power line at a second photovoltaic assembly of the plurality of photovoltaic assemblies, and (3) in response to detecting the first signal on the power line at the second photovoltaic assembly, injecting a second signal onto the power line at the second photovoltaic assembly.

(A2) The method denoted as (A1) may further include (1) detecting the second signal on the power line at a third photovoltaic assembly of the plurality of photovoltaic assemblies and (2) in response to detecting the second signal on the power line at the third photovoltaic assembly, injecting a third signal onto the power line at the third photovoltaic assembly.

(A3) The method denoted as (A2) may further include shutting down the third photovoltaic assembly in response to detecting the second signal on the power line at the third photovoltaic assembly.

(A4) Any one of the methods denoted as (A1) through (A3) may further include (1) shutting down the first photovoltaic assembly in response to the event occurrence and (2) shutting down the second photovoltaic assembly in response to detecting the first signal on the power line at the second photovoltaic assembly.

(A5) Any one of the methods denoted as (A1) through (A4) may further include detecting the event occurrence.

(A6) Any one of the methods denoted as (A1) through (A5) may further include transmitting electrical power from the plurality of photovoltaic assemblies to a load via the power line.

(A7) The method denoted as (A6) may further include detecting an additional signal on the power line at the load, the additional signal being generated by one of the photovoltaic assemblies of the plurality of photovoltaic assemblies and indicating the event occurrence.

(A8) In any one of the methods denoted as (A1) through (A7), each of the first signal and the second signal may have a frequency that is not present during normal operation of the photovoltaic system.

(A9) In any one of the methods denoted as (A1) through (A8), each of the first signal and the second signal may simulate noise generated by an electrical arc.

(A10) In any one of methods denoted as (A1) through (A9), the event may be selected from the group consisting of an electrical arc in the photovoltaic system, an abnormal status code generated by an element of the photovoltaic system, an over-temperature condition within the photovoltaic system, an abnormally high positive or negative current magnitude within the photovoltaic system, frequent or persistent bypass diode conduction, abnormally high or low voltage magnitude within the photovoltaic system, or an abnormally high impedance magnitude within the photovoltaic system.

(A11) In any one of the methods denoted as (A1) through (A10), each of the plurality of photovoltaic assemblies may be a photovoltaic module, each photovoltaic module including a plurality of photovoltaic cells electrically coupled together.

(A12) In any one of the methods denoted as (A1) through (A11) the step of injecting the first signal onto the power line may include operating a DC-to-DC converter of the first photovoltaic assembly in a predetermined manner, the DC-to-DC converter electrically interfacing one or more photovoltaic cells of the first photovoltaic assembly with the power line.

(A13) In the method denoted as (A12), the step of operating the DC-to-DC converter of the first photovoltaic assembly in the predetermined manner may include operating the DC-to-DC converter at a predetermined frequency representing occurrence of the event.

(B1) A photovoltaic assembly capable of communicating an event occurrence may include (1) an output port, (2) one or more photovoltaic cells electrically interfaced with the output port, (3) an abnormal frequency detector configured to detect the event occurrence from a first electrical signal at the output port, and (4) an injection subsystem configured to inject a second signal onto the output port in response to detection of the event occurrence by the abnormal frequency detector.

(B2) The photovoltaic assembly denoted as (B1) may further include a shutdown subsystem configured to shut down the first photovoltaic assembly in response to detection of the event occurrence by the abnormal frequency detector.

(B3) Any one of the photovoltaic assemblies denoted as (B1) and (B2) may further include a DC-to-DC converter electrically interfacing the one or more photovoltaic cells with the output port.

(B4) In the photovoltaic assembly denoted as (B3), the injection subsystem may be at least partially embodied by the DC-to-DC converter.

(B5) In any one of the photovoltaic assemblies denoted as (B3) and (B4), the DC-to-DC converter may be configured to cause the one or more photovoltaic cells to operate at an operating point which at least substantially maximizes electrical power collectively generated by the one or more photovoltaic cells.

(B6) In any one of the photovoltaic assemblies denoted as (B1) through (B5), the abnormal frequency detector may include an electrical arc fault detector configured to detect an electrical arc from the first electrical signal at the output port.

(B7) Any one of the photovoltaic assemblies denoted as (B1) through (B5) may further include (1) a sensing subsystem configured to generate an output port signal representing at least one of voltage across the output port and current flowing through the output port, (2) a frequency analysis subsystem configured to decompose the output port signal into alternating current (AC) constituent components, and (3) a power line communication subsystem configured to obtain communication data from the AC constituent components. The abnormal frequency detector may include an electrical arc fault detector configured to detect an electrical arc from the AC constituent components.

(C1) A photovoltaic system may include a power line, a first photovoltaic assembly, and a second photovoltaic assembly. The first photovoltaic assembly may include (1) a first output port electrically coupled to the power line, (2) one or more first photovoltaic cells electrically interfaced with the first output port, (3) a first abnormal frequency detector configured to detect an event occurrence from a first electrical signal at the first output port, and (4) a first injection subsystem configured to inject a second signal onto the first output port in response to detection of the event occurrence by the first abnormal frequency detector. The second photovoltaic assembly may include (1) a second output port electrically coupled to the power line, (2) one or more second photovoltaic cells electrically interfaced with the second output port, (3) a second abnormal frequency detector configured to detect the event occurrence from the second electrical signal at the second output port, and (4) a second injection subsystem configured to inject a third signal onto the second output port in response to detection of the event occurrence by the second abnormal frequency detector.

(C2) The photovoltaic system denoted as (C1) may further include a third photovoltaic assembly, including (1) a third output port electrically coupled to the power line, (2) one or more third photovoltaic cells electrically interfaced with the third output port, (3) a third abnormal frequency detector configured to detect the event occurrence from the third electrical signal at the third output port, and (4) a third injection subsystem configured to inject a fourth signal onto the third output port in response to detection of the event occurrence by the third abnormal frequency detector.

(C3) In any one of the photovoltaic systems denoted as (C1) and (C2), (1) the first photovoltaic assembly may further include a first shutdown subsystem configured to shut down the first photovoltaic assembly in response to detection of the event occurrence by the first abnormal frequency detector, and (2) the second photovoltaic assembly may further include a second shutdown subsystem configured to shut down the second photovoltaic assembly in response to detection of the event occurrence by the second abnormal frequency detector.

(C4) In any one of the photovoltaic systems denoted as (C1) through (C3), (1) the first photovoltaic assembly may further include a first DC-to-DC converter electrically interfacing the one or more first photovoltaic cells with the first output port, (2) the first injection subsystem may be at least partially embodied by the first DC-to-DC converter, (3) the second photovoltaic assembly may further include a second DC-to-DC converter electrically interfacing the one or more second photovoltaic cells with the second output port, and (4) the second injection subsystem may be at least partially embodied by the second DC-to-DC converter.

(C5) In the photovoltaic system denoted as (C4), (1) the first DC-to-DC converter may be configured to cause the one or more first photovoltaic cells to operate at an operating point that at least substantially maximizes electrical power collectively generated by the one or more first photovoltaic cells and (2) the second DC-to-DC converter may be configured to cause the one or more second photovoltaic cells to operate at an operating point that at least substantially maximizes electrical power collectively generated by the one or more second photovoltaic cells.

(C6) In any one of the photovoltaic systems denoted as (C1) through (C5), (1) the first abnormal frequency detector may include a first electrical arc fault detector configured to detect an electrical arc in the photovoltaic system and (2) the second abnormal frequency detector may include a second electrical arc fault detector configured to detect an electrical arc in the photovoltaic system.

(C7) In any one of the photovoltaic systems denoted as (C1) through (C6), each of the first and second signals may have a respective frequency that is not present during normal operation of the photovoltaic system.

(C8) In any one of the photovoltaic systems denoted as (C1) through (C7), (1) the first photovoltaic assembly may further include a first sensing subsystem configured to generate a first output port signal representing at least one of voltage across the first output port and current flowing through the first output port, (b) a first frequency analysis subsystem configured to decompose the first output port signal into first alternating current (AC) constituent components, and (c) a first power line communication subsystem configured to obtain communication data from the first AC constituent components. The first abnormal frequency detector may include a first electrical arc fault detector configured to detect an electrical arc from the first AC constituent components.

(C9) In the photovoltaic assembly denoted as (C8), the second photovoltaic assembly may further include (1) a second sensing subsystem configured to generate a second output port signal representing at least one of voltage across the second output port and current flowing through the second output port, (2) a second frequency analysis subsystem configured to decompose an electrical signal at the second output port into second AC constituent components, and (3) a second power line communication subsystem configured to obtain communication data from the second AC constituent components. The second abnormal frequency detector may include a second electrical arc fault detector configured to detect an electrical arc from the second AC constituent components.

(C10) Any one of the photovoltaic systems denoted as (C1) through (C9) may further include a load electrically coupled to the power line, the load configured to detect one or more signals on the power line indicating the event occurrence.

Changes may be made in the above assemblies, systems, and methods without departing from the scope hereof. It should thus be noted that the matter contained in the above description and shown in the accompanying drawings should be interpreted as illustrative and not in a limiting sense.

What is claimed is:

1. A method for communicating an event occurrence among a plurality of photovoltaic assemblies of a photovoltaic system, the plurality of photovoltaic assemblies being electrically coupled to a power line, comprising the steps of:

detecting, at a first photovoltaic assembly of the plurality of photovoltaic assemblies, the event occurrence using a first abnormal frequency detector of the first photovoltaic assembly;

in response to detecting the event occurrence at the first photovoltaic assembly, injecting a first signal onto the power line at the first photovoltaic assembly using a first injection subsystem of the first photovoltaic assembly, the first signal representing occurrence of the event;

detecting, at a second photovoltaic assembly of the plurality of photovoltaic assemblies, the event occurrence from presence of the first signal on the power line using a second abnormal frequency detector of the second photovoltaic assembly; and in response to detecting the first signal on the power line at the second photovoltaic assembly, injecting a second signal onto the power line at the second photovoltaic assembly using a second injection subsystem of the second photovoltaic assembly, the second signal representing occurrence of the event.

2. The method of claim 1, further comprising:
detecting, at a third photovoltaic assembly of the plurality of photovoltaic assemblies, occurrence of the event from presence of the second signal on the power line; and
in response to detecting the event occurrence at the third photovoltaic assembly, injecting a third signal onto the power line at the third photovoltaic assembly, the third signal representing the event occurrence.

3. The method of claim 2, further comprising shutting down the third photovoltaic assembly in response to detecting the second signal on the power line at the third photovoltaic assembly.

4. The method of claim 1, further comprising:
shutting down the first photovoltaic assembly in response to the event occurrence; and
shutting down the second photovoltaic assembly in response to detecting the first signal on the power line at the second photovoltaic assembly.

5. The method of claim 1, further comprising transmitting electrical power from the plurality of photovoltaic assemblies to a load via the power line.

6. The method of claim 5, further comprising detecting an additional signal on the power line at the load, the additional signal being generated by one of the photovoltaic assemblies of the plurality of photovoltaic assemblies and indicating the event occurrence.

7. The method of claim 1, wherein each of the first signal and the second signal has a frequency that is not present during normal operation of the photovoltaic system.

8. The method of claim 1, wherein each of the first signal and the second signal simulates noise generated by an electrical arc.

9. The method of claim 1, the event being selected from the group consisting of an electrical arc in the photovoltaic system, an abnormal status code generated by an element of the photovoltaic system, an over-temperature condition within the photovoltaic system, an abnormally high positive or negative current magnitude within the photovoltaic system, frequent or persistent bypass diode conduction, abnormally high or low voltage magnitude within the photovoltaic system, or an abnormally high impedance magnitude within the photovoltaic system.

10. The method of claim 1, each of the plurality of photovoltaic assemblies being a photovoltaic module, each photovoltaic module including a plurality of photovoltaic cells electrically coupled together.

11. The method of claim 1, the step of injecting the first signal onto the power line comprising operating a DC-to-DC converter of the first photovoltaic assembly in a predetermined manner, the DC-to-DC converter electrically interfacing one or more photovoltaic cells of the first photovoltaic assembly with the power line.

12. A method for communicating an event occurrence among a plurality of photovoltaic assemblies of a photovoltaic system, comprising the steps of:
detecting, at a first photovoltaic assembly of the plurality of photovoltaic assemblies, the event occurrence;
in response to detecting the event occurrence, injecting a first signal onto a power line at the first photovoltaic assembly, the first signal representing occurrence of the event;
detecting the first signal on the power line at a second photovoltaic assembly of the plurality of photovoltaic assemblies; and
in response to detecting the first signal on the power line at the second photovoltaic assembly, injecting a second signal onto the power line at the second photovoltaic assembly, the second signal representing occurrence of the event,
the step of injecting the first signal onto the power line comprising operating a DC-to-DC converter of the first photovoltaic assembly in a predetermined manner, the DC-to-DC converter electrically interfacing one or more photovoltaic cells of the first photovoltaic assembly with the power line, and
the step of operating the DC-to-DC converter of the first photovoltaic assembly in the predetermined manner comprising operating the DC-to-DC converter at a predetermined frequency representing occurrence of the event.

13. A photovoltaic assembly capable of communicating an event occurrence, comprising:
a first output port;
one or more photovoltaic cells electrically interfaced with the first output port;
an abnormal frequency detector configured to detect the event occurrence from a first electrical signal at the first output port; and
an injection subsystem configured to inject a second electrical signal onto the first output port in response to detection of the event occurrence by the abnormal frequency detector, the second signal having a frequency simulating the event, for detection by an abnormal frequency detector of another photovoltaic assembly.

14. The photovoltaic assembly of claim 13, further comprising a shutdown subsystem configured to shut down the photovoltaic assembly in response to detection of the event occurrence by the abnormal frequency detector.

15. The photovoltaic assembly of claim 13, further comprising a DC-to-DC converter electrically interfacing the one or more photovoltaic cells with the first output port.

16. The photovoltaic assembly of claim 15, the injection subsystem being at least partially embodied by the DC-to-DC converter.

17. The photovoltaic assembly of claim 15, the DC-to-DC converter being configured to cause the one or more photovoltaic cells to operate at an operating point which at least substantially maximizes electrical power collectively generated by the one or more photovoltaic cells.

18. The photovoltaic assembly of claim 13, the abnormal frequency detector comprising an electrical arc fault detector configured to detect an electrical arc from the first electrical signal at the first output port.

19. The photovoltaic assembly of claim 13, further comprising:
a sensing subsystem configured to generate an output port signal representing at least one of voltage across the first output port and current flowing through the first output port;
a frequency analysis subsystem configured to decompose the output port signal into alternating current (AC) constituent components; and a power line communication subsystem configured to obtain communication data from the AC constituent components;

wherein the abnormal frequency detector comprises an electrical arc fault detector configured to detect an electrical arc from the AC constituent components.

\* \* \* \* \*